(12) United States Patent
Kaneda et al.

(10) Patent No.: US 10,297,715 B2
(45) Date of Patent: May 21, 2019

(54) NITRIDE SEMICONDUCTOR ULTRAVIOLET LIGHT-EMITTING ELEMENT

(71) Applicant: Soko Kagaku Co., Ltd., Ishikawa (JP)

(72) Inventors: Michiko Kaneda, Aichi (JP); Cyril Pernot, Ishikawa (JP); Akira Hirano, Aichi (JP)

(73) Assignee: SOKO KAGAKU CO., LTD., Ishikawa (JP)

( * ) Notice: Subject to any disclaimer, the term of this patent is extended or adjusted under 35 U.S.C. 154(b) by 0 days.

(21) Appl. No.: 15/573,824

(22) PCT Filed: Jul. 21, 2015

(86) PCT No.: PCT/JP2015/070656
§ 371 (c)(1),
(2) Date: Nov. 13, 2017

(87) PCT Pub. No.: WO2017/013729
PCT Pub. Date: Jan. 26, 2017

(65) Prior Publication Data
US 2018/0261725 A1  Sep. 13, 2018

(51) Int. Cl.
*H01L 33/32* (2010.01)
*H01L 33/16* (2010.01)
*H01L 33/00* (2010.01)
*H01L 33/12* (2010.01)
(Continued)

(52) U.S. Cl.
CPC ............ *H01L 33/32* (2013.01); *H01L 33/007* (2013.01); *H01L 33/0025* (2013.01);
(Continued)

(58) Field of Classification Search
CPC ... H01L 33/00; H01L 33/002; H01L 33/0025; H01L 33/007; H01L 33/06; H01L 33/12;
(Continued)

(56) References Cited

U.S. PATENT DOCUMENTS 6,252,255 B1  6/2001  Ueta et al.
2009/0057646 A1  3/2009  Hirayama et al.
(Continued)

FOREIGN PATENT DOCUMENTS

EP  2747220 A1  6/2014
JP  2002016000 A  1/2002
(Continued)

OTHER PUBLICATIONS

EP Extended European Search Report in related EP patent application No. 15898889.9, dated Jul. 9, 2018, 8 pages.
(Continued)

*Primary Examiner* — Monica D Harrison
(74) *Attorney, Agent, or Firm* — Haynes Beffel & Wolfeld LLP

(57) ABSTRACT

A nitride semiconductor ultraviolet light-emitting element comprises an underlying portion that includes a substrate that is composed of sapphire and has a surface inclined to a (0001) surface so as to form a multi-step terrace, and an AlN layer formed on a surface of the substrate, and a light-emitting portion that is formed on a surface of the underlying portion and includes an active layer having an AlGaN based semiconductor layer. At least the AlN layer of the underlying portion, the active layer of the light-emitting portion, and each layer between the AlN layer and the active layer are formed by step flow growth in which a side surface of a multi-step terrace grows so as to achieve two-dimensional growth. The active layer has a quantum well structure including at least a well layer composed of AlGaN. The average roughness of a 25 μm by 25 μm region on a surface of the active layer is a thickness of the well layer or more and 10 nm or less.

9 Claims, 18 Drawing Sheets

(51) Int. Cl.
  *H01L 33/22* (2010.01)
  *H01L 33/06* (2010.01)
  *H01L 33/18* (2010.01)
  *H01L 33/24* (2010.01)
(52) U.S. Cl.
  CPC .............. *H01L 33/06* (2013.01); *H01L 33/12* (2013.01); *H01L 33/16* (2013.01); *H01L 33/18* (2013.01); *H01L 33/22* (2013.01); *H01L 33/24* (2013.01)
(58) Field of Classification Search
  CPC ......... H01L 33/18; H01L 33/22; H01L 33/24; H01L 33/32
  USPC .......................................................... 257/13
  See application file for complete search history.

(56) References Cited

U.S. PATENT DOCUMENTS

| | | |
|---|---|---|
| 2010/0002738 A1 | 1/2010 | Takakura et al. |
| 2010/0118905 A1 | 5/2010 | Yabushita et al. |
| 2012/0223329 A1 | 9/2012 | Kinoshita et al. |
| 2014/0103289 A1* | 4/2014 | Liao .................... H01L 21/0237 257/13 |
| 2014/0158983 A1 | 6/2014 | Pernot et al. |

FOREIGN PATENT DOCUMENTS

| | | |
|---|---|---|
| JP | 2003347226 A | 12/2003 |
| JP | 2004335635 A | 11/2004 |
| JP | 2006060164 A | 3/2006 |
| JP | 2006066641 A | 3/2006 |
| JP | 2009054780 A | 3/2009 |
| JP | 2010016092 A | 1/2010 |
| JP | 2010135733 A | 6/2010 |
| JP | 2013222746 A | 10/2013 |
| WO | 2011058968 A1 | 5/2011 |
| WO | 2013/021464 A1 | 2/2013 |

OTHER PUBLICATIONS

Maeda et al, "characteristics of aln crystal growth depending on m- and a-axis oriented off-angle of c-sapphire substrate and fabrication of high-efficiency algan deep-uv leds," IEICE Technical Report, Nov. 10, 2011, vol. 111, No. 292, (LQE2011 96-122), pp. 107-112—English language abstract only.

Shen et al., "Impact of Vicinal Sapphire {0001} Substrates on the High-Quality AlN Films by Plasma-Assisted Molecular Beam Epitaxy," Japanese Journal of Applied Physics, vol. 42, Part 2, No. 11A, Nov. 1, 2003, 3 pages.

* cited by examiner

Sample 1

Fig. 7A  Sample 3
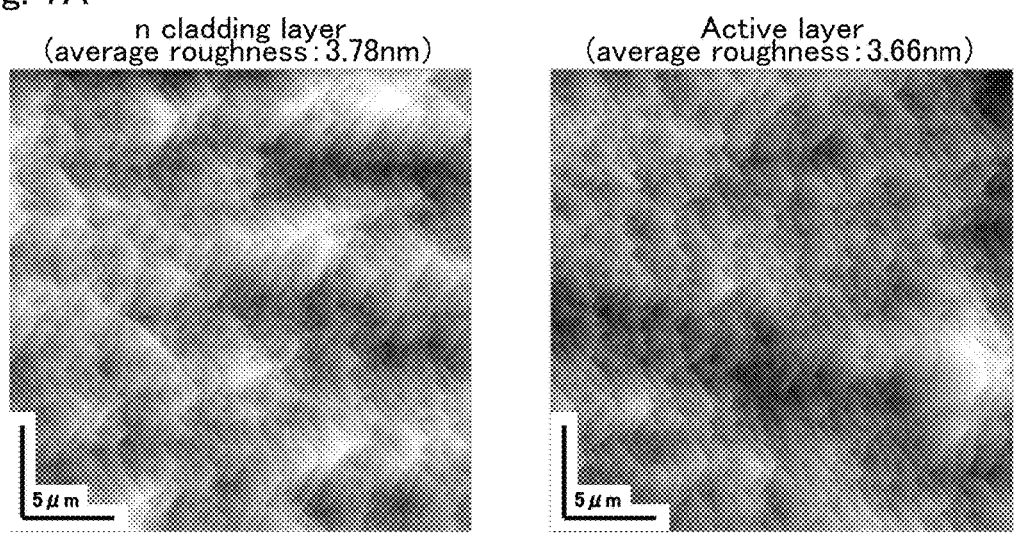
Fig. 7B
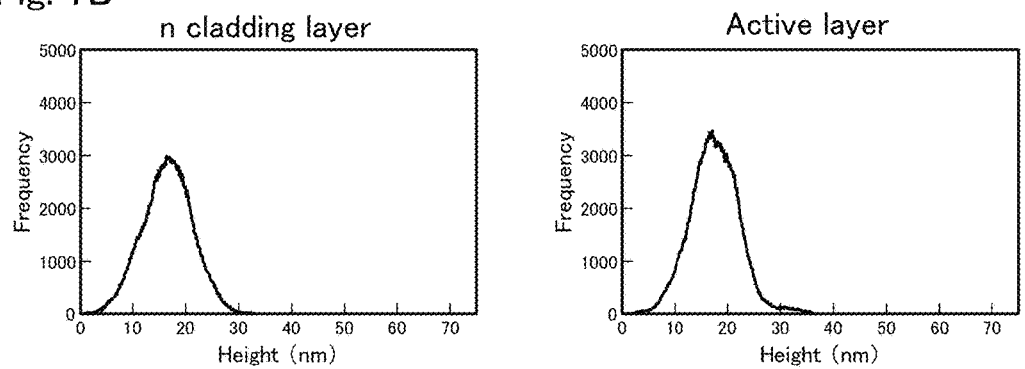
Fig. 7C
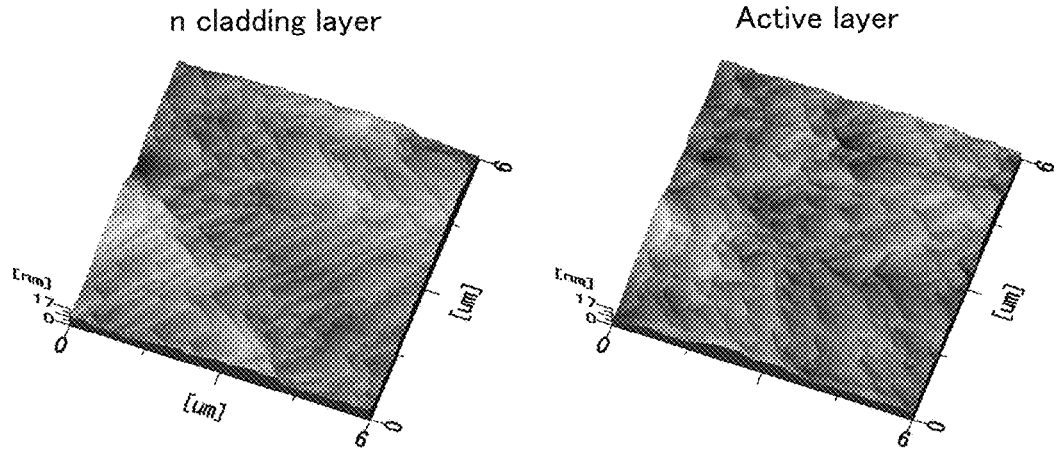

Sample 4 n cladding layer
(average roughness: 3.83nm)

Active layer
(average roughness: 3.94nm)

n cladding layer

Active layer

Sample 1

Terrace width
2.55 μm

Terrace height
5.0nm

Sample A

Fig. 12A — Terrace width 2.19 μm

Fig. 12B — Terrace height 6.0 nm

Sample 2

Terrace width
0.95 μm

Terrace height
8.6nm

Sample 3

Terrace width
0.73 μm

Terrace height
8.4nm

Sample 4

Terrace width
0.53 μm

Terrace height
9.2 nm

Sample 5

Terrace width
0.35 μm

Terrace height
13.2nm

NITRIDE SEMICONDUCTOR ULTRAVIOLET LIGHT-EMITTING ELEMENT

TECHNICAL FIELD

The present invention relates to a nitride semiconductor light-emitting element obtained by forming an AlGaN based active layer above a substrate composed of sapphire, and more particularly to a nitride semiconductor ultraviolet light-emitting element having a peak emission wavelength in the ultraviolet region.

BACKGROUND ART

Conventionally, nitride semiconductor blue light-emitting elements using a GaN based nitride semiconductor for an active layer have been widely used. However, nitride semiconductor ultraviolet light-emitting elements using an AlGaN based nitride semiconductor having a shorter emission wavelength than the GaN based nitride semiconductor for an active layer still have not been widely used.

This is because AlGaN based nitride semiconductors composed of mixed crystals mainly of AlN and GaN have a special characteristic that bonding strength of Al and N in AlN is much larger than bonding strength of Ga and N in GaN, so that high quality crystals are difficult to grow. In particular, even if the growth method of a GaN based nitride semiconductor, which has already been established, is employed as a growth method of an AlGaN based nitride semiconductor, it is impossible to form crystals that have quality as high as GaN, which is problematic.

To handle such a problem, various methods of improving the crystallinity of the AlGaN based nitride semiconductor are proposed in, for example, Patent Documents 1 to 4. Specifically, Patent Document 1 proposes a method of preventing a crack in AlN from extending upward by forming a buffer layer on a sapphire substrate using a plurality of paired layers each of which is obtained by alternately laminating AlN and GaN. Patent Document 2 proposes a method of reducing a threading dislocation by locally reducing the growth speed of an AlN layer by supplying $NH_3$, which is a material gas of N, in a pulsed manner for a certain period of time at the time of forming a buffer layer composed of AlN on a sapphire substrate. Patent Document 3 proposes a method of reducing a threading dislocation by completely covering island cores composed of AlGaN formed on a sapphire substrate by an AlGaN buffer layer having a larger Al composition ratio than the cores. Patent Document 4 proposes a method of improving the crystallinity of an AlGaN based nitride semiconductor formed above a substrate by optimizing an off angle of the sapphire substrate.

PRIOR ART DOCUMENTS

Patent Documents

Patent Document 1: Japanese Patent Application Publication NO. 2006-66641
Patent Document 2: Japanese Patent Application Publication NO. 2009-54780
Patent Document 3: Japanese Patent Application Publication NO. 2013-222746
Patent Document 4: WO 2013/021464

SUMMARY OF THE INVENTION

Problems to be Solved by the Invention

The methods proposed in Patent Documents 1 to 4 improve the crystallinity of a nitride semiconductor layer formed above a substrate or a buffer layer by optimizing the substrate or the buffer layer formed on a surface of the substrate.

Indeed, if a substrate or a buffer layer, which is a start point of crystal growth, is optimized, it is expected that the crystallinity of a nitride semiconductor layer above the substrate or the buffer layer improves. However, such methods eliminate only defects in the entire element that are propagated from the underlayer to upward layers, such as cracks and threading dislocations. For this reason, if these methods are employed, an active layer where light emission occurs is not necessarily optimized. Consequently, a light output is not necessarily improved in nitride semiconductor ultraviolet light-emitting elements obtained with the methods proposed in Patent Documents 1 to 4, which is problematic.

An object of the present invention is to provide a nitride semiconductor ultraviolet light-emitting element that includes an active layer having a high light output.

Means for Solving the Problem

In order to achieve the above object, the present invention provides a nitride semiconductor ultraviolet light-emitting element that comprises an underlying portion that includes a substrate that is composed of sapphire and has a surface inclined to a (0001) surface so as to form a multi-step terrace, and an AlN layer formed on a surface of the substrate, and a light-emitting portion that is formed on a surface of the underlying portion and includes an active layer having an AlGaN based semiconductor layer. At least the AlN layer of the underlying portion, the active layer of the light-emitting portion, and each layer between the AlN layer and the active layer are formed by step flow growth in which a side surface of a multi-step terrace grows so as to achieve two-dimensional growth. The active layer has a quantum well structure including at least a well layer composed of $Al_XGa_{1-X}N$ (0<X<1). The average roughness of a 25 μm by 25 μm region on a surface of the active layer is the thickness of the well layer or more and 10 nm or less.

In the nitride semiconductor ultraviolet light-emitting element, as Ga segregates in the active layer (in particular, the well layer) by step flow growth in which the average roughness of the surface of the active layer is the thickness of the well layer or more and 10 nm or less, it is possible to increase a light output of the active layer.

In addition, in the nitride semiconductor ultraviolet light-emitting element described above, the average roughness of a 25 μm by 25 μm region on the surface of the active layer included in the light-emitting portion is preferably larger than or equal to 3 nm.

In the nitride semiconductor ultraviolet light-emitting element, Ga sufficiently segregates in the active layer (in particular, the well layer). It is thus possible to sufficiently increase the light output of the active layer.

In addition, in the nitride semiconductor ultraviolet light-emitting element described above, the average roughness of a 25 μm by 25 μm region on the surface of the active layer included in the light-emitting portion is preferably less than or equal to 6 nm.

The nitride semiconductor ultraviolet light-emitting element can significantly increase the light output of the active layer.

In addition, in the nitride semiconductor ultraviolet light-emitting element described above, the average roughness of a 25 μm by 25 μm region on a surface of a layer that is included in the light-emitting portion and is formed immediately before the active layer is preferably the thickness of the well layer or more and 10 nm or less. Moreover, in the nitride semiconductor ultraviolet light-emitting element described above, a rate obtained by dividing an absolute value of a difference between the average roughness of a 25 μm by 25 μm region on the surface of the active layer and the average roughness of a 25 μm by 25 μm region on the surface of a layer that is included in the light-emitting portion and is formed immediately before the active layer by the average roughness of a 25 μm by 25 μm region on the surface of the active layer is preferably less than or equal to 10%.

In these nitride semiconductor ultraviolet light-emitting elements, the active layer is formed by uniform growth in which the average roughness of a grown surface is kept, and thus Ga surely segregates in the active layer (in particular, the well layer). Consequently, it is possible to increase the light output of the active layer.

In addition, in the nitride semiconductor ultraviolet light-emitting element described above, on a surface of the AlN layer included in the underlying portion, the average width of a terrace in an inclination direction of the substrate as viewed from the top is preferably 0.3 μm or more and 1 μm or less. Additionally, in the nitride semiconductor ultraviolet light-emitting element described above, on the surface of the AlN layer included in the underlying portion, the average height of a step formed by a terrace is preferably 8 nm or more and 14 nm or less.

In these nitride semiconductor ultraviolet light-emitting elements, as the light-emitting portion is formed on the surface of the underlying portion including the AlN layer, Ga segregates by the step flow growth described above, and thus it is possible to obtain an active layer having a high light output.

In addition, in the nitride semiconductor ultraviolet light-emitting element described above, on the surface of the active layer included in the light-emitting portion, the frequency distribution of the height of a 25 μm by 25 μm region preferably has a curved shape in which as the height increases from 0, the height simply increases while changing from its downward convex curve to its upward convex curve to reach a maximum value, and the height then simply decreases while changing from its upward convex curve to its downward convex curve.

In the nitride semiconductor ultraviolet light-emitting element, as the influence of a hillock is small and the step flow growth is dominant, Ga segregates and thus it is possible to obtain the active layer having a high light output.

Moreover, in the nitride semiconductor ultraviolet light-emitting element described above, the peak emission wavelength is preferably 230 nm or more and 340 nm or less.

In the nitride semiconductor ultraviolet light-emitting element, Ga sufficiently segregates in the active layer (in particular, the well layer) and thus a light output increases. Further, problems that an emission spectrum is deformed and the intensity of emission decreases hardly occur.

Effect of the Invention

In the nitride semiconductor ultraviolet light-emitting element described above, as Ga segregates in the active layer (in particular, the well layer) by step flow growth in which the average roughness of the surface of the active layer is the thickness of the well layer or more and 10 nm or less, it is possible to increase the light output of the active layer. Consequently, it is possible to obtain a nitride semiconductor ultraviolet light-emitting element that includes an active layer having a high light output.

BRIEF DESCRIPTION OF THE DRAWINGS

FIGS. 7A to 7C show the state of a surface of an n-type cladding layer in sample 3 and the state of a surface of the active layer in sample 3 in comparison.

FIGS. 12A to 12C are AFM images showing the state of a surface of an AlN layer in an underlying portion of sample A.

DESCRIPTION OF EMBODIMENT

An embodiment of a nitride semiconductor ultraviolet light-emitting element according to the present invention (hereinafter, referred to as "light-emitting element") is described based on the drawings. The embodiment described below is only a mode carried out on the assumption that the light-emitting element according to the present invention is a light-emitting diode, and the present invention is not limited to the following embodiment. For example, the light-emitting element according to the present invention may be carried out as other light-emitting elements including a semiconductor laser or may be carried out as a light-emitting diode having a different configuration from the following embodiment.

<Configurational Example of Light-Emitting Element>

Figure 1:
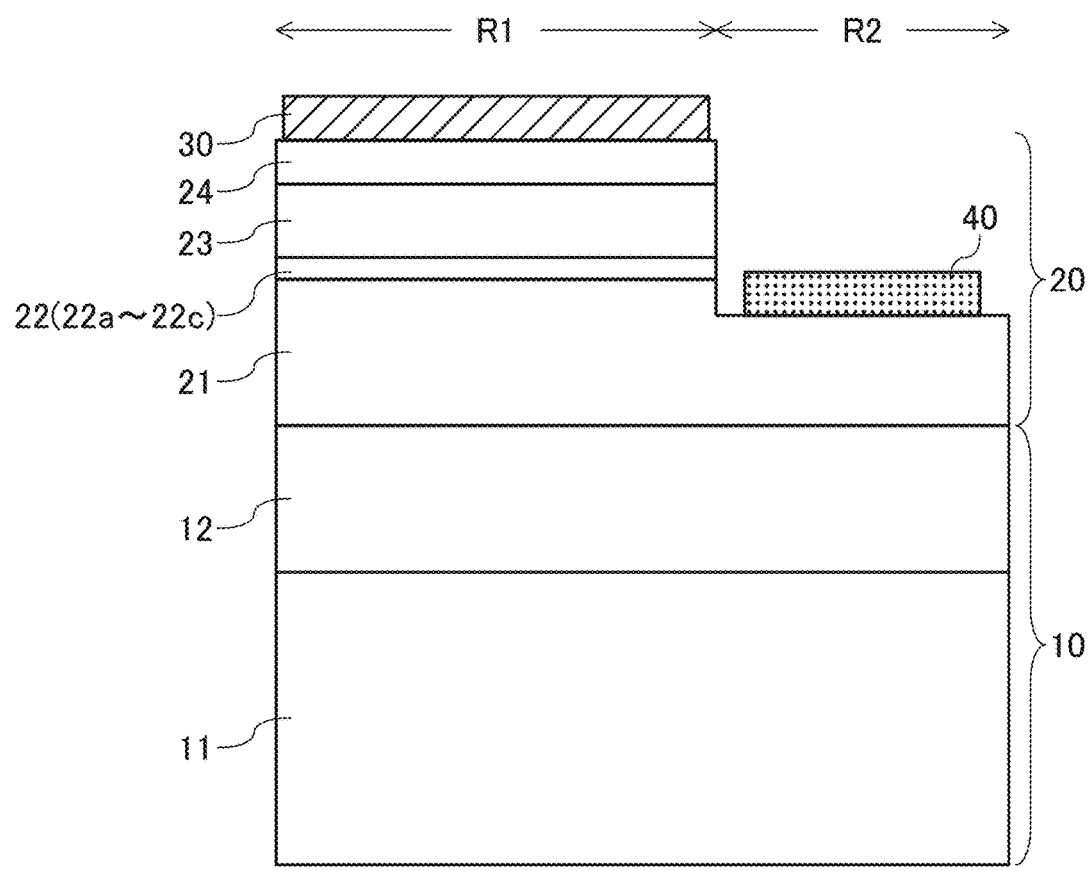
FIG. 1 is a cross-sectional view showing a main part, schematically illustrating an example of a configuration of a light-emitting element according to an embodiment of the present invention.

An example of a configuration of the light-emitting element according to the embodiment of the present invention is described first with reference to the drawings. FIG. 1 is a cross-sectional view showing a main part, schematically illustrating an example of the configuration of the light-emitting element according to the embodiment of the present invention. In FIG. 1, main parts are exaggerated and the contents of the invention are schematically shown for easy understanding of the description. For this reason, a dimension ratio of each portion is not always equal to a dimension ratio of an actual element.

As shown in FIG. 1, a light-emitting element 1 according to the embodiment of the present invention includes an underlying portion 10, a light-emitting portion 20 formed on a surface of the underlying portion 10 (that is, an upper surface of the underlying portion 10 in FIG. 1; a lower surface of the underlying portion 10 in FIG. 1 is referred to as "rear surface"; this is applied to the following description), and a p-electrode 30 and an n-electrode 40 for supplying power to the light-emitting element 1 (in particular, the light-emitting portion 20). The underlying portion 10 corresponds to a base for forming the light-emitting portion 20. The light-emitting portion 20 is constituted by various layers required for light emission.

The underlying portion 10 includes a substrate 11 composed of sapphire and an AlN layer 12 that is formed on a surface of the substrate 11 and composed of AlN. The AlN layer 12 is obtained by causing AlN to epitaxially grow on the surface of the substrate 11 at a high temperature of approximately 1150 to 1300° C. While it seems that the underlying portion 10 includes only the AlN layer 12 on the substrate 11 in the light-emitting element 1 shown in FIG. 1, the underlying portion 10 may include other layers in addition to the AlN layer 12 if needed. For example, an AlGaN layer composed of AlGaN or n-type AlGaN may be added on the AlN layer 12 (under the light-emitting portion 20).

The light-emitting portion 20 includes an n-type cladding layer 21 composed of n-type AlGaN, an active layer 22, a p-type cladding layer 23 composed of p-type AlGaN, and a p-type contact layer 24 composed of p-type GaN in order from the side of the underlying portion 10. Parts of the active layer 22, the p-type cladding layer 23, and the p-type contact layer 24 formed above the n-type cladding layer 21 are removed by reactive ion etching or the like, so that a part of a surface of the n-type cladding layer 21 is exposed. Layers from the active layer 22 to the p-type contact layer 24 are thus formed on a partial region (a first region R1) on the n-type cladding layer 21.

The p-electrode 30 is composed of, for example, Ni/Au and is formed on a surface of the p-type contact layer 24. The n-electrode 40 is composed of, for example, Ti/Al/Ti/Au, and is formed on a part of the surface of the n-type cladding layer 21 other than the first region R1 (a second region R2).

Figure 2:
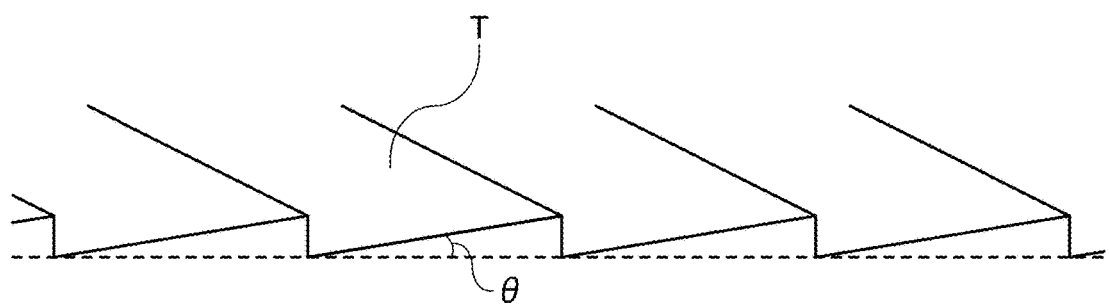
FIG. 2 is a perspective view schematically showing the state of a surface of an off substrate that is enlarged to an atomic level.

An off substrate whose surface is inclined to a sapphire (0001) surface by a small angle is used as the substrate 11 in the light-emitting element 1. The state of the surface of the off substrate is described with reference to the drawings. FIG. 2 is a perspective view schematically showing the state of the surface of the off substrate enlarged to an atomic level. In FIG. 2, main parts are exaggerated and the contents of the invention are schematically shown for easy understanding of the description. For this reason, a dimension ratio of each portion is not always equal to a dimension ratio of an actual element.

As shown in FIG. 2, multi-step terraces T are formed on the surface of the substrate 11, which is an off substrate. This is because when a bulk single crystal of sapphire is cut out at an angle (that is, an off angle θ) at which the bulk single crystal is slightly inclined to a (0001) surface, the (0001) surface is exposed along a cut out direction. The magnitude of the off angle θ and the direction in which the off angle is formed (specifically, an inclination direction of the (0001) surface, for example, an m axis direction, an a axis direction, or the like) may be freely determined if desired growth is achieved in each layer on the substrate 11.

The active layer 22 has a quantum well structure including at least one well layer 22a composed of $Al_XGa_{1-X}N$ (0<X<1). The film thickness of the well layer 22a is determined so that a quantum size effect (a quantum confinement effect) exhibits, and is, for example, less than or equal to 10 nm. In a typical quantum well structure, the well layer 22a is sandwiched between barrier layers 22b having a larger bandgap than the well layer 22a. For example, when the well layer 22a is composed of AlGaN, the barrier layer 22b is composed of AlGaN or n-type AlGaN having a larger AlN molar fraction than the well layer 22a. The quantum well structure included in the active layer 22 may be a single-layer quantum well structure constituted by only a quantum well structure or may be a multi-layer quantum well structure obtained by stacking a plurality of quantum well structures. For example, the film thickness of the well layer 22a is 2 nm or more and 3 nm or less. For example, the film thickness of the barrier layer 22b is 6 nm or more and 8 nm or less.

In addition, the active layer 22 includes an electron blocking layer 22c composed of p-type AlGaN having a larger AlN molar fraction than the well layer 22a and the barrier layer 22b on an interface (an outermost surface) contacting the p-type cladding layer 23. The electron blocking layer 22c prevents electrons injected into the active layer 22 from entering the p-type cladding layer 23. For example, the film thickness of the electron blocking layer 22c is 15 nm or more and 30 nm or less, and is typically 20 nm.

The barrier layer 22b and the electron blocking layer 22c are not essential in the active layer 22. However, it is preferable to provide the barrier layer 22b and the electron blocking layer 22c because it is possible to confine a large number of electrons and holes in the well layer 22a and to efficiently recombine the electrons and the holes (that is, emit light).

AlGaN composing the layers described above is formed using a well-known epitaxial growth method such as a metal organic vapor phase epitaxy (MOVPE) method or a molecular beam epitaxy (MBE) method. In the layers described above, a donor impurity, for example, Si is added to an n-type layer. Additionally, in the layers described above, an acceptor impurity, for example, Mg is added to a p-type layer. In the layers described above, a layer composed of AlN or AlGaN that does not specify a conductivity type is an undoped layer not having an impurity added thereto. AlGaN, AlN, and GaN composing the layers described above may partially or completely contain other elements as long as characteristics do not change significantly (For example, AlGaN may contain a small amount of In or AlN may contain a small amount of Ga.).

The AlN molar fraction of the n-type cladding layer 21, the barrier layer 22b, and the p-type cladding layer 23 is, for example, 30% or more and 80% or less (preferably, 50% or more and 80% or less and more preferably 55% or more and 80% or less), and the AlN molar fraction of the well layer 22a is, for example, 5% or more and 80% or less (preferably, 5% or more and 60% or less). Here, the AlN molar fraction of the well layer 22a is less than the AlN molar fraction of the n-type cladding layer 21, the barrier layer 22b, and the p-type cladding layer 23 (In contrast, the GaN molar fraction of the well layer 22a is larger than the GaN molar fraction of the n-type cladding layer 21, the barrier layer 22b, and the p-type cladding layer 23.). When an AlGaN layer is added to the underlying portion 10, the AlN molar fraction of the AlGaN layer may be in the same range as the n-type cladding layer 21, the barrier layer 22b, and the p-type cladding layer 23.

For example, the peak emission wavelength of the light-emitting element 1 is 230 nm or more and 350 or less. The light-emitting element 1 is, for example, a rear-face output type light-emitting element in which light emission from the active layer 22 is taken out from the side of the substrate 11. When an AlGaN layer is added to the underlying portion 10, the AlN molar fraction of the AlGaN layer is set to be larger than the AlN molar fraction of the well layer 22a. In this case, the AlN molar fraction of the AlGaN layer may be set to be equal to the AlN molar fraction of the n-type cladding layer 21, or may be set to be larger than the AlN molar fraction of the n-type cladding layer 21.

For the film thickness of AlGaN composing the layers of the light-emitting portion 20 other than the active layer 22, for example, the film thickness of AlGaN in the n-type cladding layer 21 is 2000 nm or more and 4000 nm or less, the film thickness of AlGaN in the p-type cladding layer 23 is 500 nm or more and 600 nm or less, and the film thickness of AlGaN in the p-type contact layer 24 is 100 nm or more and 300 nm or less. In the underlying portion 10, the film thickness of the AlN layer 12 is, for example, 1500 nm or more and 4000 nm or less. When an AlGaN layer is added to the underlying portion 10, the film thickness of the AlGaN layer is, for example, 200 nm or more and 300 nm or less.

Figure 3:
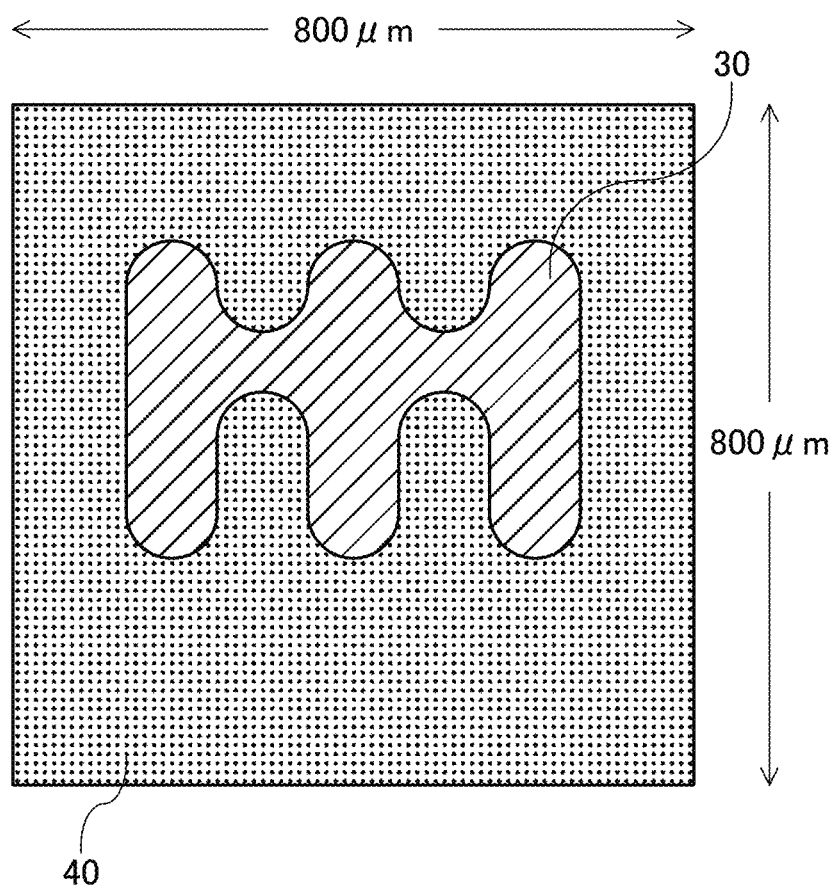
FIG. 3 is a plan view schematically showing a light-emitting element as viewed from the side of a p-electrode and an n-electrode.

Next, the p-electrode 30 and the n-electrode 40 are described with reference to the drawings. FIG. 3 is a plan view schematically showing a light-emitting element as viewed from the side of a p-electrode and an n-electrode.

As shown in FIG. 3, the p-electrode 30 is formed on the substantially overall first region R1 and the n-electrode 40 is formed on the substantially overall second region R2. The chip size of the light-emitting element 1 is 800 μm by 800 μm and the area of the first region R1 on which the p-electrode 30 is formed is approximately 168000 μm².

The p-electrode 30 and the n-electrode 40 are formed as follows. For example, a photoresist functioning as an inversion pattern of an electrode (a pattern that covers a surface other than an electrode forming position) is formed, a multi-layer metal film constituting the electrode is then deposited on the photoresist by an electron beam deposition method or the like, and the photoresist and the multi-layer metal film on the photoresist are removed by lift-off. After one or both of the p-electrode 30 and the n-electrode 40 is formed, if needed, a thermal process may be performed by RTA (rapid thermal annealing) or the like.

<Conditions for Obtaining Active Layer Having High Light Output>

[Surface Roughness of Active Layer]

According to common knowledge in the field of semiconductor light-emitting elements, to obtain the active layer 22 having a high light output, the crystal growth of the active layer 22 should be growth that prevents defects hindering light emission, such as dislocations and cracks, from being included, that is, two-dimensional growth that keeps the flatness of a grown surface (growth enabling precise lamination of each layer). In particular, to uniformly grow the well layer 22a that is extremely thin, for example, has a thickness of a few nm while preventing defects from being included, the roughness of a grown surface should be at least less than the thickness of the well layer 22a.

However, the applicants of the present application have earnestly studied and found that the active layer 22 having a high light output is obtained by performing growth that intentionally keeps large roughness of a grown surface at the time of crystal growth of the active layer 22 (in particular, the well layer 22a). This is described below with reference to the drawings.

The roughness of a grown surface at the time of the crystal growth of the active layer 22 can be represented using average roughness of a surface of the active layer 22 after growth. For example, the average roughness can be calculated by the following formula (1) using height (relative height when predetermined height within a measuring area of a measured object is 0) measured by an atomic force microscope (AFM). In the following formula (1), Z(i) indicates the height of each point measured by an AFM, Ze indicates an average of the height Z(i), and Ha indicates average roughness.

$$Ze = \frac{1}{n}\sum_{i=1}^{n} Z(i), \; Ra = \frac{1}{n}\sum_{i=1}^{n} |Z(i) - Ze| \qquad (1)$$

Figure 4:
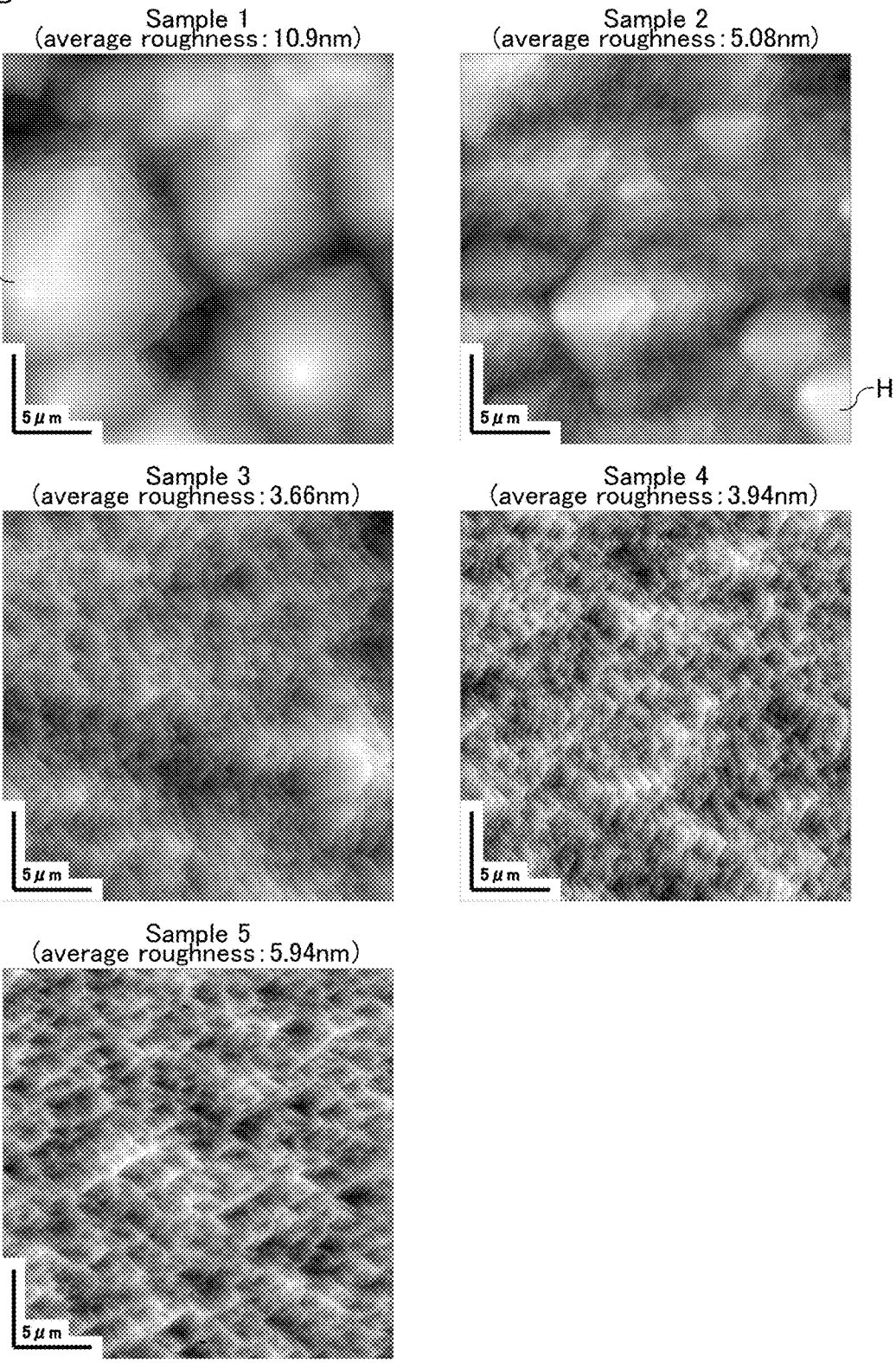
FIG. 4 shows AFM images showing the state of surfaces of active layers in samples 1 to 5.
Figure 5:
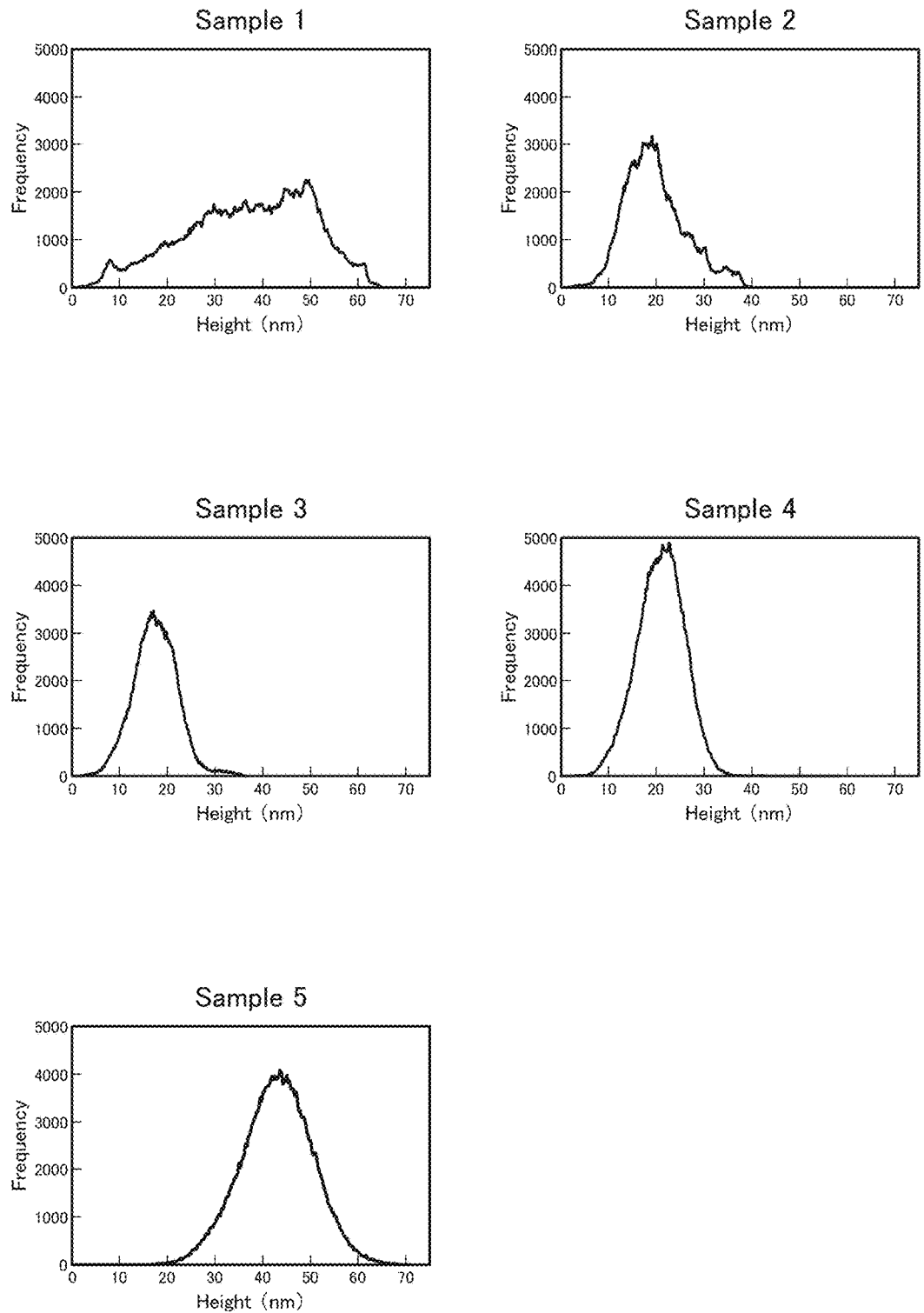
FIG. 5 shows histograms showing the frequency distribution of the height of the surfaces of the active layers in samples 1 to 5.

FIG. 4 shows AFM images showing the state of surfaces of active layers in samples 1 to 5. In AFM images shown in FIG. 4 and other drawings, a brighter (whiter) region represents a higher region. FIG. 4 also shows average roughness in a 25 μm by 25 μm region (hereinafter, simply referred to as "average roughness"). FIG. 5 shows histograms showing the frequency distribution of the height of the surfaces of the active layers in samples 1 to 5. FIG. 5 shows the frequency distribution of the height of each of 25 μm by 25 μm regions in samples 1 to 5 shown in FIG. 4.

The 25 μm by 25 μm region for calculating average roughness and frequency distribution has the maximum size for calculating the average roughness and height using an AFM. Additionally, the 25 μm by 25 μm region is large enough to obtain a substantially constant value regardless of the location within a chip. The numerical value 25 μm does not have a particular meaning, and other regions as large as the 25 μm by 25 μm region, for example, a 30 μm by 30 μm region and a 20 μm by 20 μm region can be used.

In samples 1 to 5 shown in FIGS. 4 and 5, the influence of a terrace T (see FIG. 2) formed on the surface of the substrate 11, which is an off substrate, is exerted on the surface of the active layer 22. Specifically, at least the AlN layer 12 of the underlying portion 10, the active layer 22 of the light-emitting portion 20, and layers between the AlN layer 12 and the active layer 22 (in this example, the n-type cladding layer 21) are formed by step flow growth in which side surfaces of multi-step terraces grow to achieve two-dimensional growth. For reference, FIGS. 11A to 16C to be described later show the state of a surface of the AlN layer 12 in the underlying portion 10. In addition, FIGS. 6A to 8C to be described later show the state of a surface of the n-type cladding layer 21 in the light-emitting portion 20.

Samples 1 to 5 are produced under conditions in which a side surface of a terrace is easier to selectively grow in order of sample 1, sample 2, sample 3, sample 4, and sample 5. That is, among samples 1 to 5, sample 1 is produced under conditions in which a side surface of a terrace is difficult to selectively grow whereas sample 5 is produced under conditions in which a side surface of a terrace selectively grows most easily. The conditions in which a side surface of a terrace is easy to selectively grow include, for example, a large off angle of the substrate 11 in a certain range (for example, in the range of 0 degrees to a few degrees), a growth speed at which a terrace is easy to appear (specifically, the growth speed is achieved by appropriately setting conditions including, for example, a growth temperature, a supply amount of a material or a carrier gas, and a flow rate), and the like.

The conditions in which a side surface of a terrace is easy to selectively grow may differ depending on the type or configuration of a film forming apparatus. Consequently, such conditions may be identified by actually producing some samples with film forming apparatuses. What is important is not to identify conditions for allowing an infinite number of combinations to be present depending on the film forming apparatuses, but to identify conditions for surely forming the active layer 22 by step flow growth.

Samples 1 to 5 are produced with different conditions as described above, and the state of a surface of the active layer 22, in particular, the average roughness of the surface of the active layer 22 differ from sample to sample. Specifically, for the average roughness of surfaces of the active layers 22 in samples 1 to 5, the average roughness of sample 1 is 10.9 nm, the average roughness of sample 2 is 5.08 nm, the average roughness of sample 3 is 3.66 nm, the average roughness of sample 4 is 3.94 nm, and the average roughness of sample 5 is 5.94 nm.

In samples 1 to 5, the layers from the AlN layer 12 of the underlying portion 10 to the active layer 22 of the light-emitting portion 20 are continuously formed by step flow growth and thus the average roughness of a surface of the active layer 22 increases. Specifically, the average roughness of surfaces of the active layers 22 in samples 1 to 5 is larger than or equal to the thickness of the well layer 22a and is larger than or equal to 3 nm. As described above, growing the active layer 22 so that the average roughness of the surface of the active layer 22 is larger than the thickness of the well layer 22a is against common knowledge in the field of semiconductor light-emitting elements.

As shown in FIG. 4, three-dimensional growth also occurs in sample 1 simultaneously with step flow growth. In the three-dimensional growth, a core at a random position on a terrace grows into a hexagonal hillock H. In addition, as shown in FIG. 5, the frequency distribution of the height of the surface of the active layer 22 in sample 1 is not normal distribution (As the height increases from 0, the height simply increases while changing from its downward convex curve to its upward convex curve to reach a maximum value. The height then simply decreases while changing from its upward convex curve to its downward convex curve), and thus the height changes irregularly. Consequently, it is found in sample 1 that the hillock H, which is a factor of irregular changes in height, has a large influence whereas a terrace, which is a factor of regular changes in height, has a small influence, and thus three-dimensional growth is dominant over step flow growth.

In addition, as shown in FIG. 4, the hillock H is also present on the surface of the active layer 22 in sample 2, similarly to sample 1. However, comparing to sample 1, the region occupied by the hillock H in sample 2 is reduced greatly. As shown in FIG. 5, the frequency distribution of the height of the surface of the active layer 22 in sample 2 is normal distribution unlike sample 1, and thus the height changes regularly to a certain extent. Consequently, it is found in sample 2 that the hillock H, which is a factor of irregular changes in height, has a small influence whereas a terrace, which is a factor of regular changes in height, has a large influence, and thus step flow growth is dominant over three-dimensional growth.

As shown in FIG. 4, a large hillock H is not generated and signs of step flow growth (multi-step and triangular facets) are found as a whole in samples 3 to 5. In addition, as shown in FIG. 5, the frequency distribution of surfaces of the active layers 22 in samples 3 to 5 has normal distribution, and thus the height changes regularly. Consequently, it is found in samples 3 to 5 that the hillock H, which is a factor of irregular changes in height, has a very small influence whereas a terrace, which is a factor of regular changes in height, has a very large influence, and thus step flow growth is more dominant over three-dimensional growth.

Meanwhile, the average roughness of the surface of the active layer 22 in sample 1 is 10.9 nm, which is much larger than the average roughness in other samples 2 to 5. This is because three-dimensional growth is dominant and the influence of the hillock H is large in sample 1. As described above, in a sample in which three-dimensional growth is dominant, the hillock H is inevitably included in a 25 μm by 25 μm region for calculating the average roughness that is defined on the surface of the active layer 22, and thus the average roughness of the surface of the active layer 22 might be larger than 10 nm.

The average roughness of the surface of the active layer 22 in sample 2 is 5.08 nm, which is larger than the average roughness in samples 3 and 4. This is because step flow growth is dominant in sample 2, but sample 2 is also influenced by the hillock H not a little.

The average roughness of the surface of the active layer 22 in sample 5 is 5.94 nm, which is larger than the average roughness in samples 3 and 4. This is not the influence of the hillock H. A step of a terrace is large in sample 5, and thus the average roughness of the surface of the active layer 22 is also large.

FIGS. 6A to 8C show the state of surfaces of n-type cladding layers in samples 1, 3, and 4, and the state of surfaces of active layers in samples 1, 3, and 4 in comparison. As shown in FIG. 1, the n-type cladding layer 21 is formed immediately before the active layer 22. That is, FIGS. 6A to 8C show the state of a surface of the active layer 22 and the state of a rear surface of the active layer 22 in comparison.

Figure 6A:
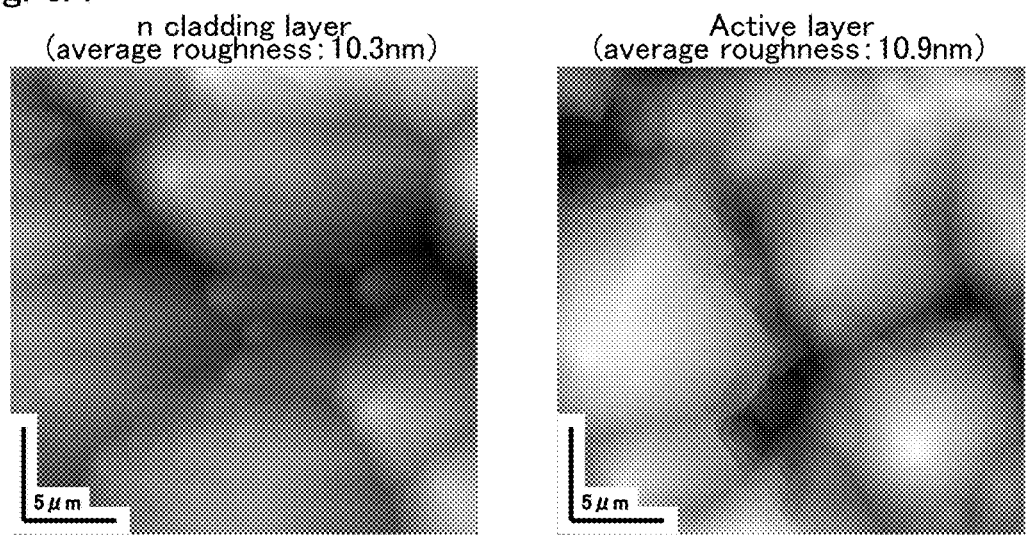
FIGS. 6A to 6C show the state of a surface of an n-type cladding layer in sample 1 and the state of a surface of the active layer in sample 1 in comparison.
Figure 6B:
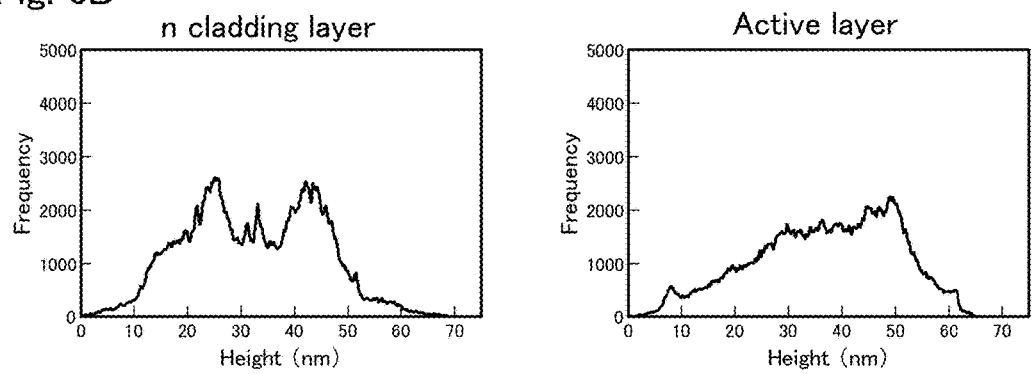
Figure 6C:
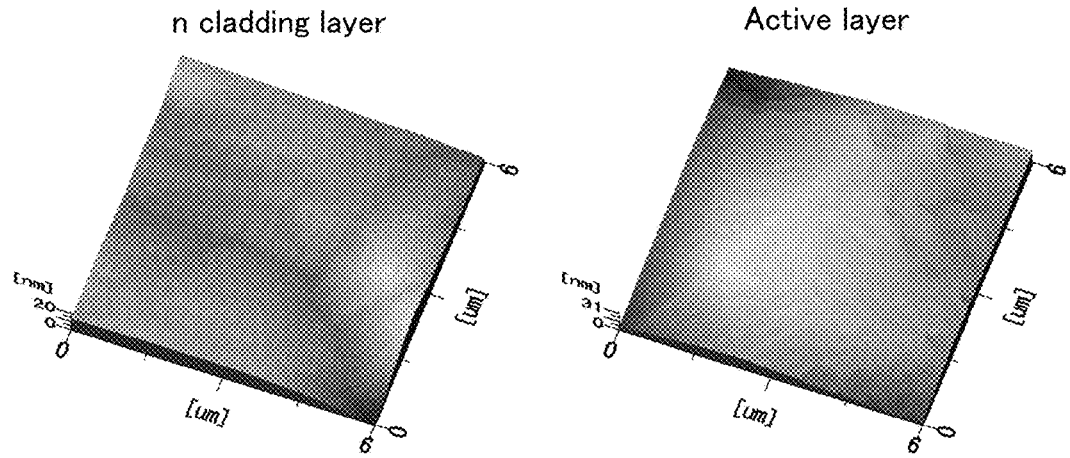
Figure 8A:
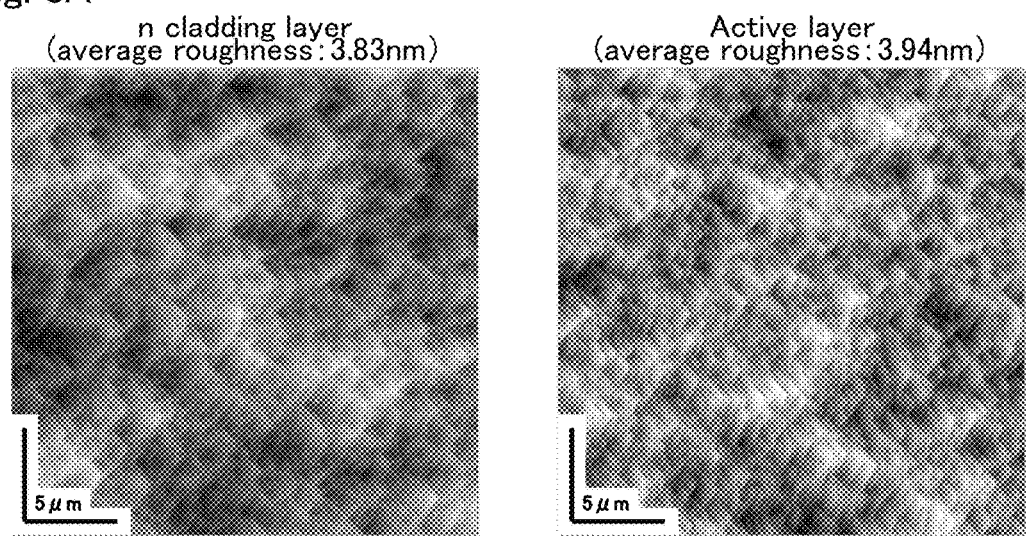
FIGS. 8A to 8C show the state of a surface of an n-type cladding layer in sample 4 and the state of a surface of the active layer in sample 4 in comparison.
Figure 8B:
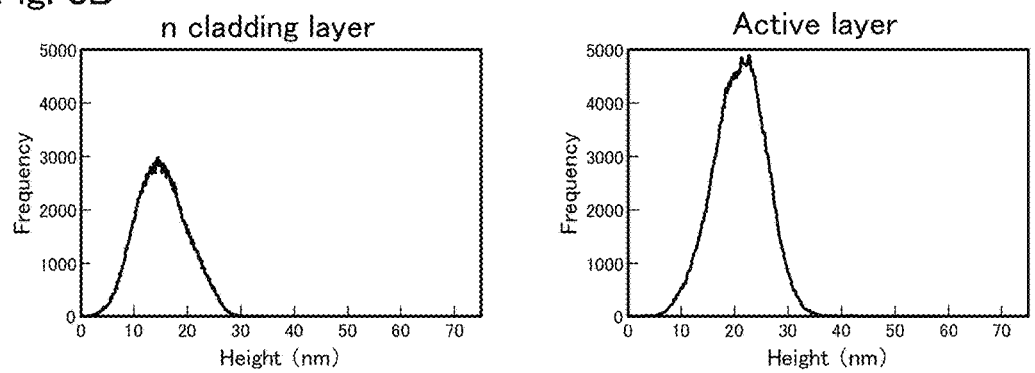
Figure 8C:
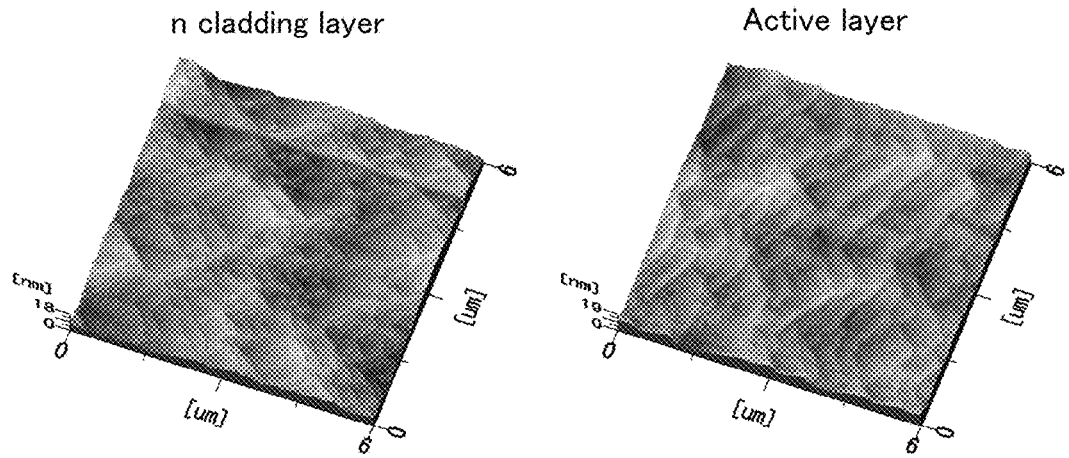

FIGS. 6A, 7A, and 8A show AFM images showing the state of a 25 μm by 25 μm region on the surface of the n-type cladding layer 21 and the state of a 25 μm by 25 μm region on the surface of the active layer 22. FIGS. 6B, 7B, and 8B show histograms showing the frequency distribution of the height of the surfaces of the n-type cladding layers 21 and the active layers 22 shown in FIGS. 6A, 7A, and 8A, respectively. FIGS. 6C, 7C, and 8C show AFM images showing regions narrower than the regions on the n-type cladding layers 21 and the active layers 22 shown in FIGS. 6A, 7A, and 8A, respectively, as three-dimensional bird's eye views. FIGS. 6A, 7A, and 8A also show the average roughness of surfaces of the n-type cladding layers 21 and the active layers 22 in samples 1, 3, and 4, respectively.

As shown in FIG. 6A, in sample 1, the average roughness of the surface of the n cladding layer 21 is 10.3 nm and the average roughness of the surface of the active layer 22 is 10.9 nm. As shown in FIG. 7A, in sample 3, the average roughness of the surface of the n cladding layer 21 is 3.78 nm and the average roughness of the surface of the active layer 22 is 3.66 nm. As shown in FIG. 8A, in sample 4, the average roughness of the surface of the n cladding layer 21 is 3.83 nm and the average roughness of the surface of the active layer 22 is 3.94 nm.

As described above, in each of samples 1, 3, and 4, the average roughness of the surface of the n cladding layer 21 is substantially equal to the average roughness of the surface of the active layer 22. In particular, the rate obtained by dividing the absolute value of the difference between the average roughness of the surface of the active layer 22 and the average roughness of the surface of the n cladding layer 21 by the average roughness of the surface of the active layer 22 is within 10%. This is because the active layer 22 is formed by uniform growth in which the average roughness of the surface is kept. While only samples 1, 3, and 4 are exemplified, the same is true for samples 2 and 5.

As shown in FIGS. 7B and 8B, in samples 3 and 4, the frequency distribution of the height of the surface of each of the n cladding layer 21 and the active layer 22 is normal distribution. This means that the active layer 22 is formed by keeping step flow growth from beginning to end. While only samples 3 and 4 are exemplified, the same is true for samples 2 and 5. In contrast, this tendency is not seen in sample 1 in which three-dimensional growth is dominant.

Meanwhile, as shown in FIGS. 7C and 8C, in samples 3 and 4, corners of terraces on the surface of the active layer 22 (multi-step and triangular facets) are rounder than corers of terraces on the surface of n cladding layer 21. This phenomenon is described with reference to FIGS. 9A, 9B, 10A, and 10B to be described later. While only samples 3 and 4 are exemplified, the same is true for samples 2 and 5. In contrast, this tendency is not seen clearly in sample 1 in which three-dimensional growth is dominant.

Figure 9A:
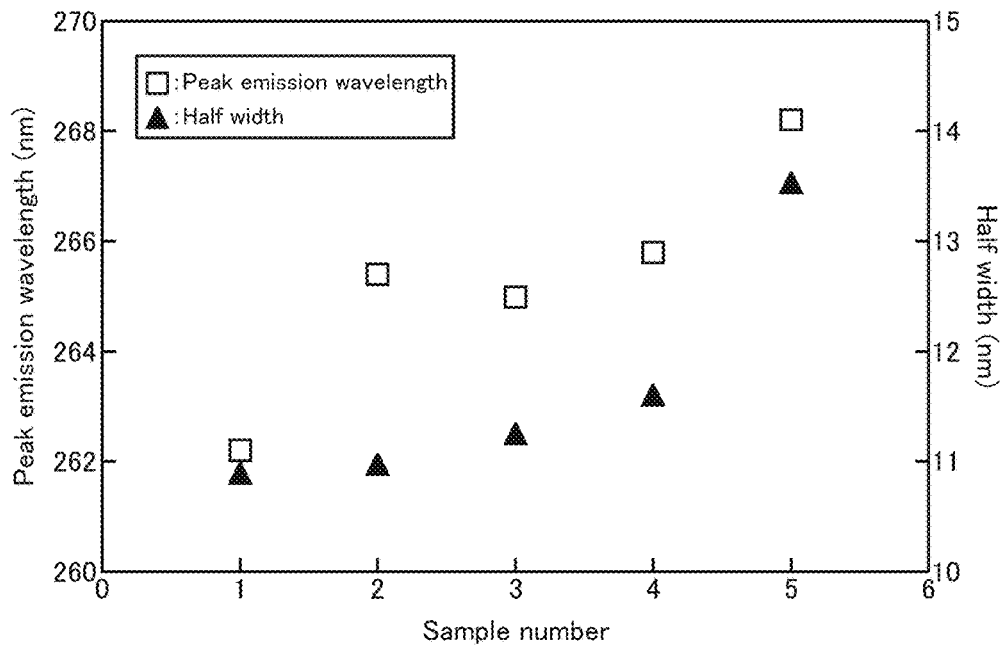
FIGS. 9A and 9B are graphs showing light emission characteristics (light outputs) of samples 1 to 5.
Figure 9B:
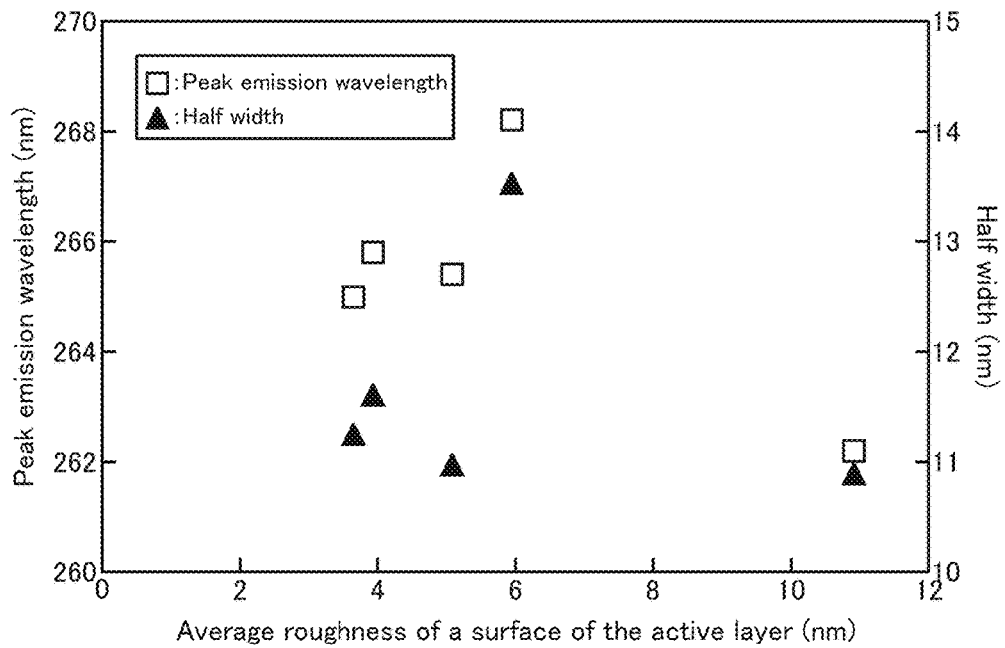
Figure 10A:
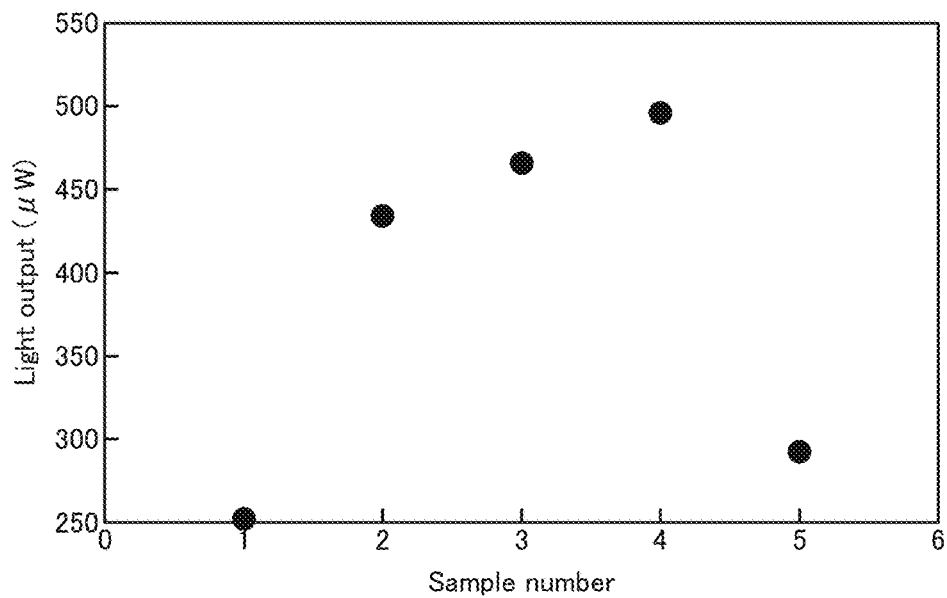
FIGS. 10A and 10B are graphs showing light emission characteristics (a peak emission wavelength and a half width) of samples 1 to 5.
Figure 10B:
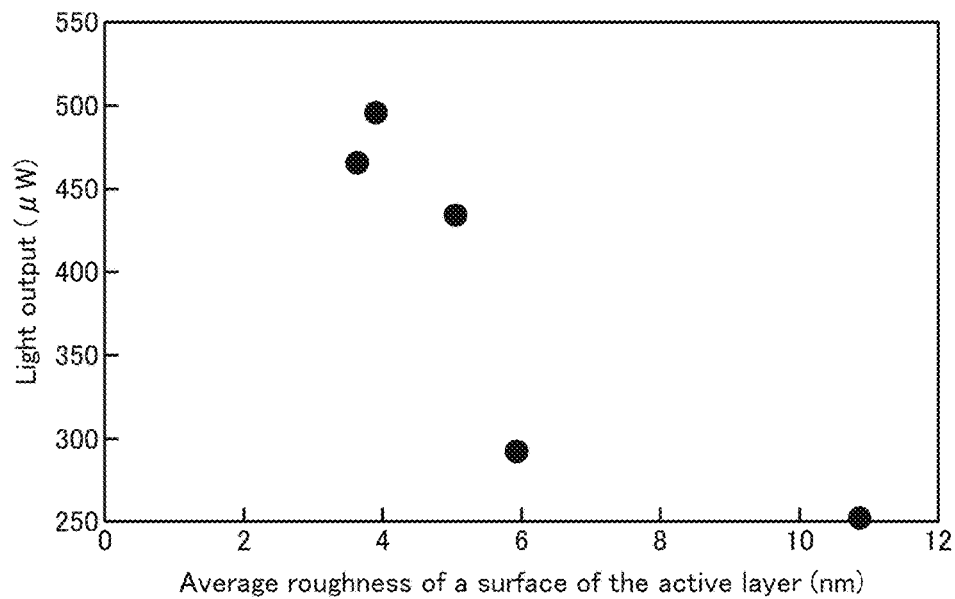
Figure 11A:
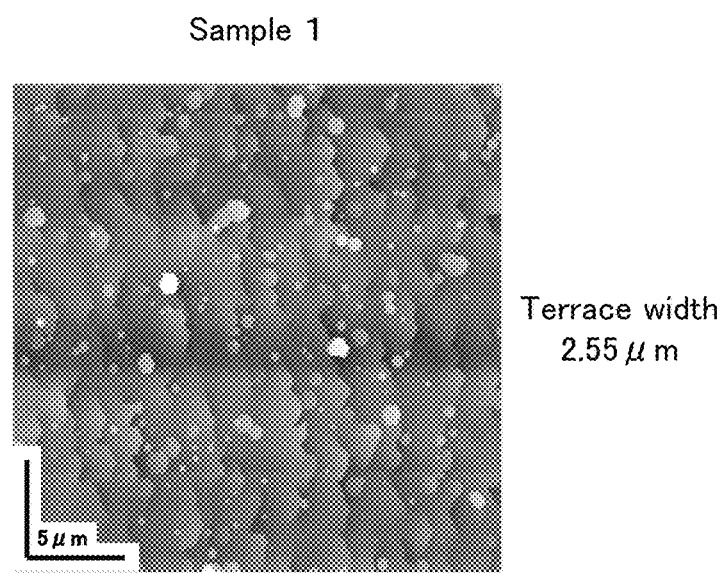
FIGS. 11A to 11C are AFM images showing the state of a surface of an AlN layer in an underlying portion of sample 1.
Figure 11B:
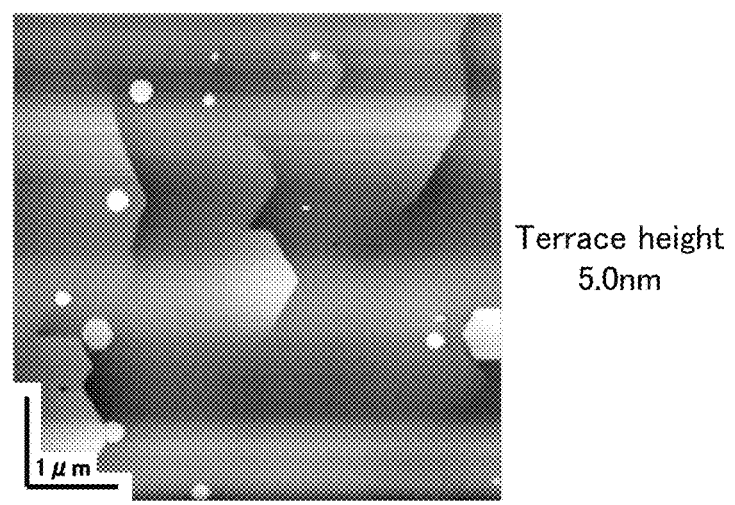
Figure 11C:
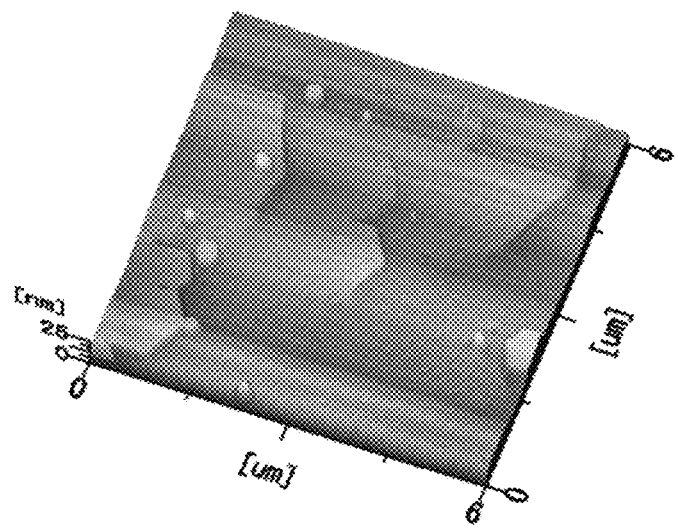
Figure 12C:
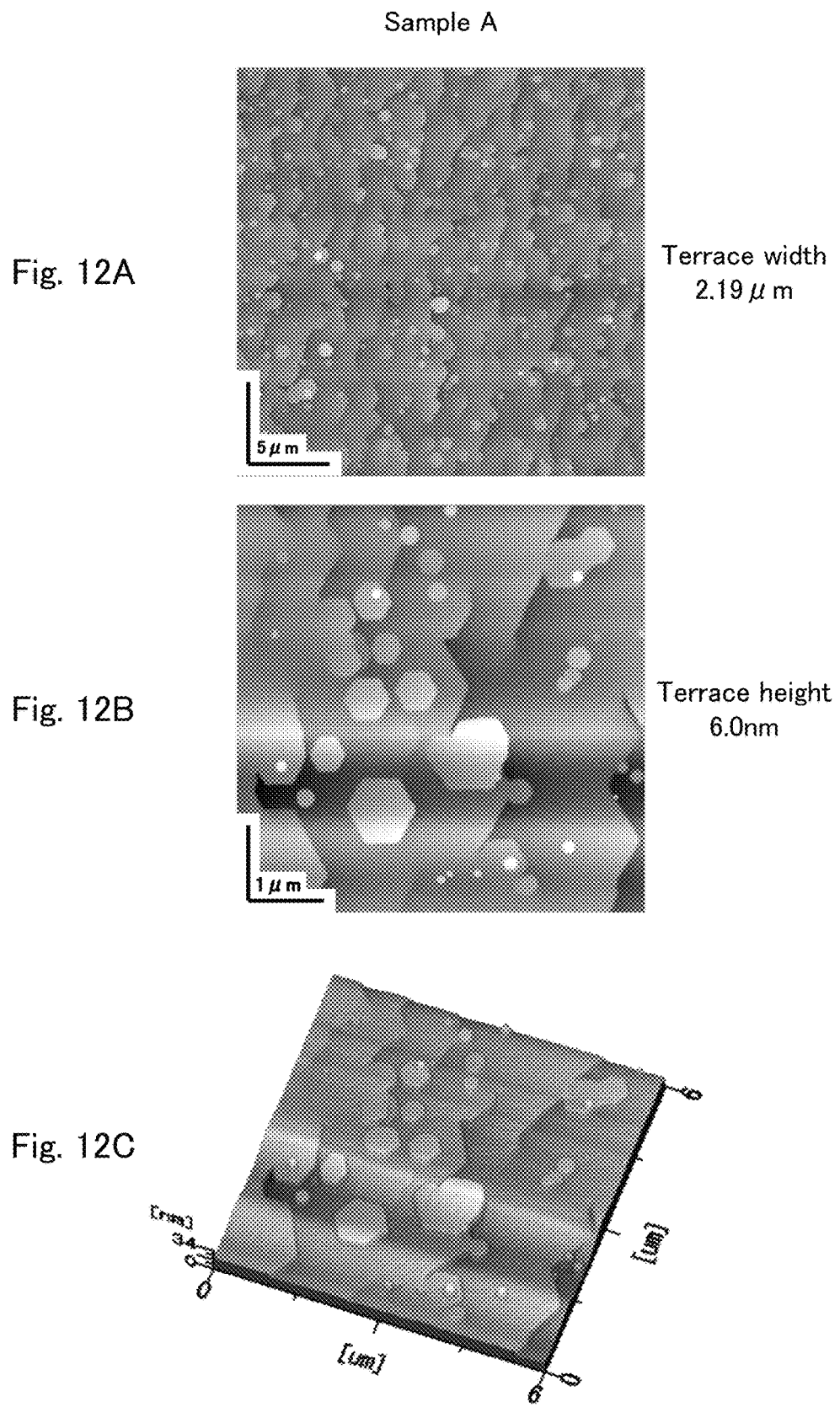
Figure 13A:
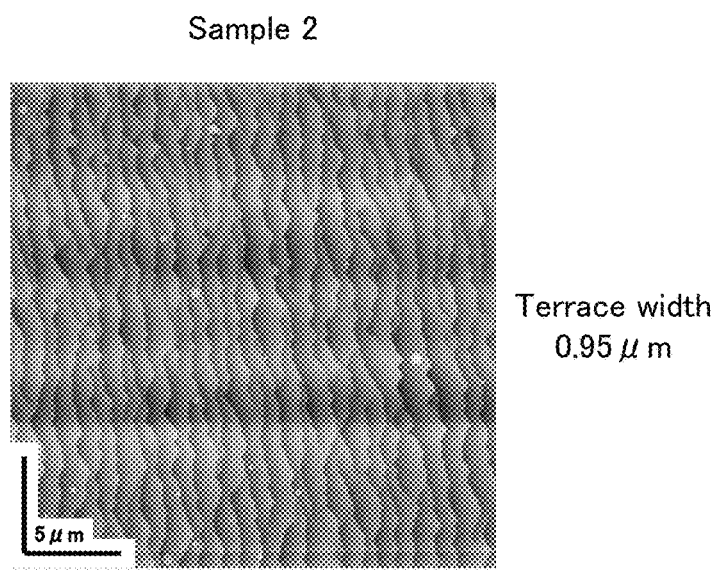
FIGS. 13A to 13C are AFM images showing the state of a surface of an AlN layer in an underlying portion of sample 2.
Figure 13B:
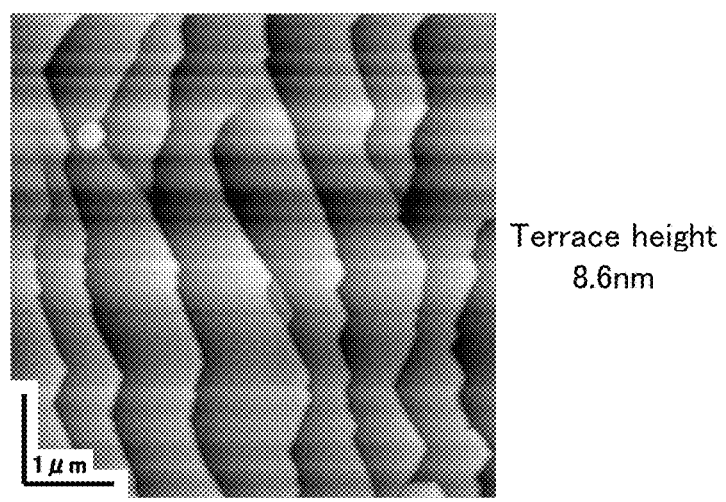
Figure 13C:
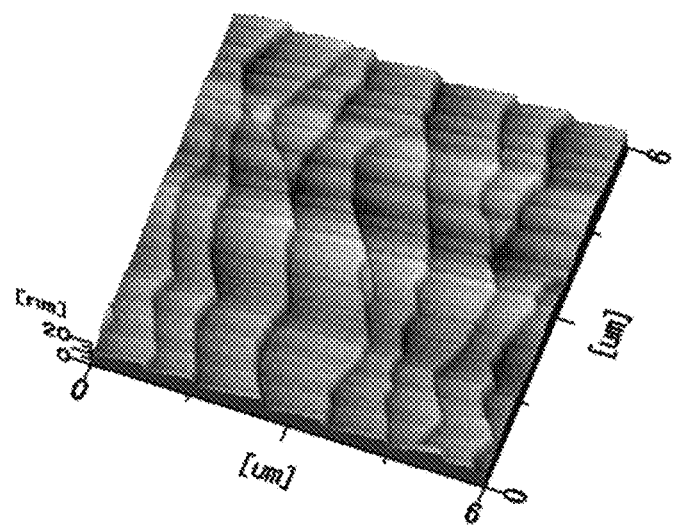
Figure 14A:
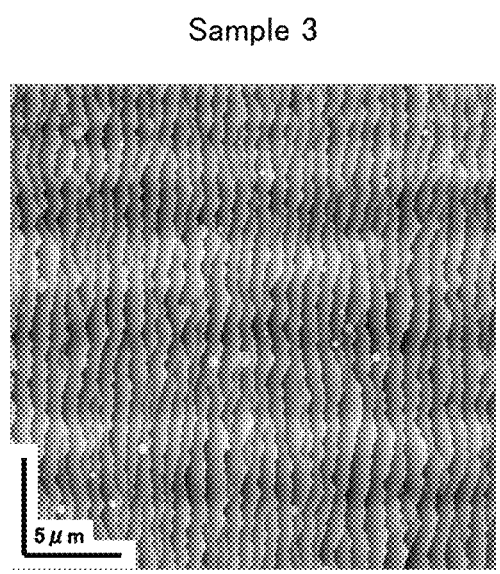
FIGS. 14A to 14C are AFM images showing the state of a surface of an AlN layer in an underlying portion of sample 3.
Figure 14B:
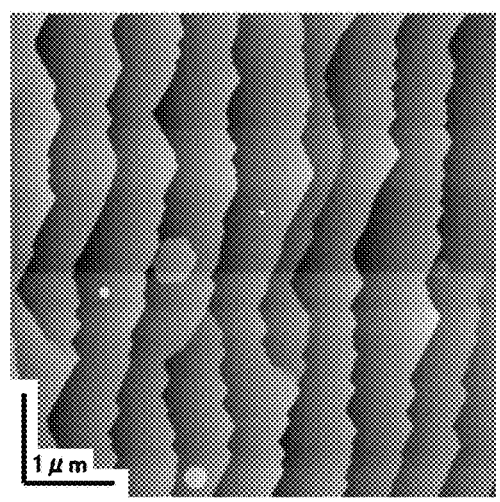
Figure 14C:
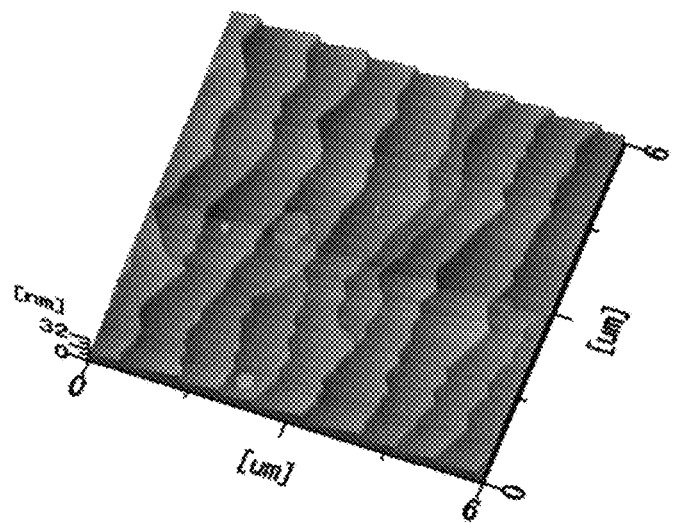
Figure 15A:
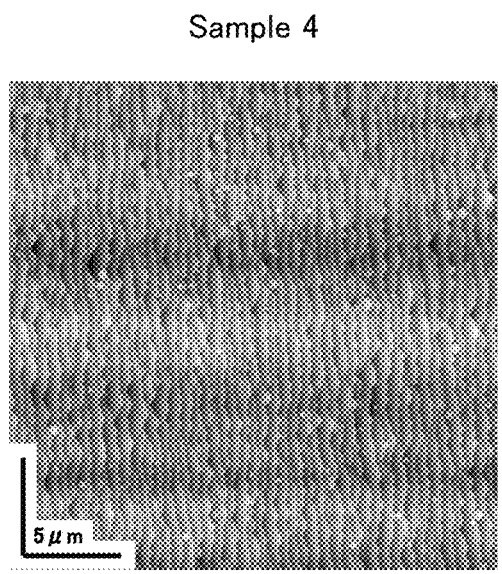
FIGS. 15A to 15C are AFM images showing the state of a surface of an AlN layer in an underlying portion of sample 4.
Figure 15B:
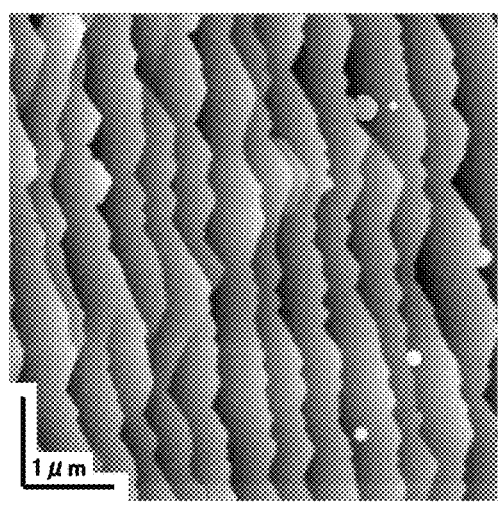
Figure 15C:
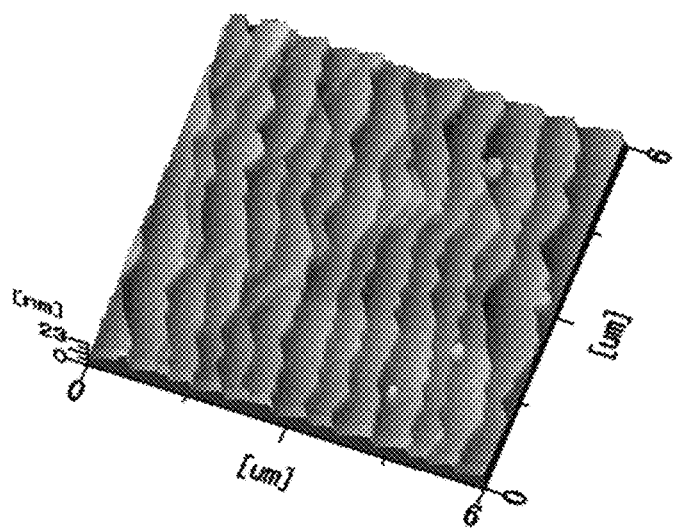
Figure 16A:
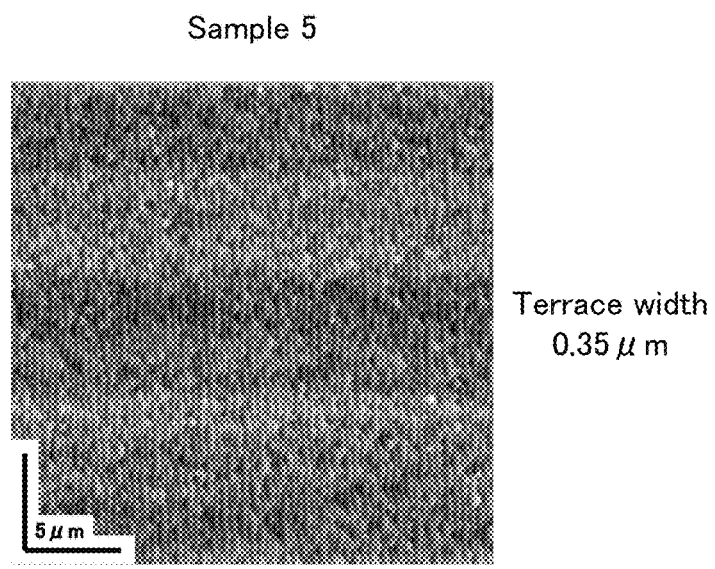
FIGS. 16A to 16C are AFM images showing the state of a surface of an AlN layer in an underlying portion of sample 5.
Figure 16B:
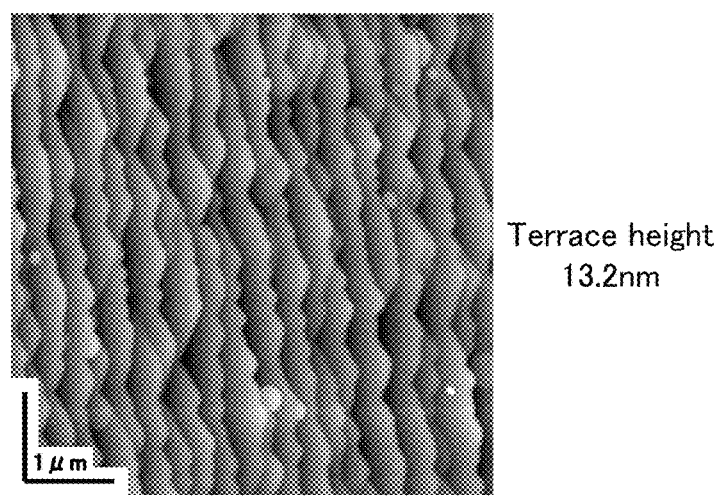
Figure 16C:
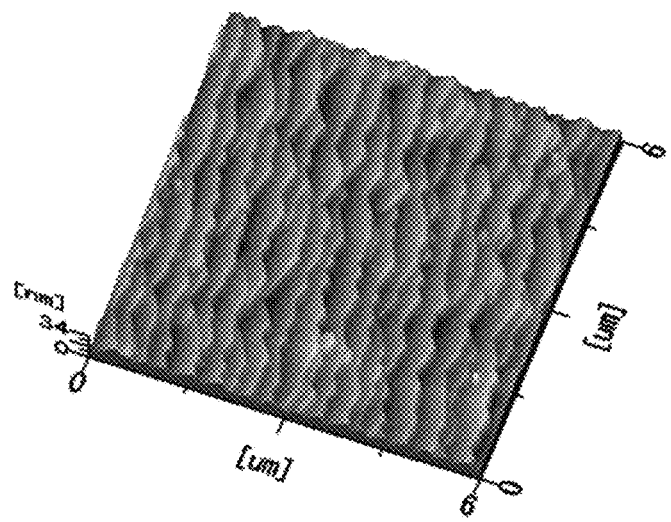

FIGS. 9A, 9B, 10A, and 10B are graphs showing light emission characteristics of samples 1 to 5. Specifically, FIGS. 9A and 9B are graphs showing the peak emission wavelength and half width of samples 1 to 5, whereas FIGS. 10A and 10B are graphs showing the light output of samples 1 to 5. FIGS. 9A and 10A are graphs in which the vertical axis represents light emission characteristics and the horizontal axis represents a sample number. FIGS. 9B and 10B are graphs in which the vertical axis represents light emission characteristics and the horizontal axis represents the average roughness of a surface of the active layer 22.

As shown in FIGS. 9A and 9B, comparing to sample 1 in which three-dimensional growth is dominant, the peak emission wavelength shifts toward a long wavelength side and the half width is larger in samples 2 to 5 in which step flow growth is dominant.

When examining such a result based on the fact that AlGaN composing the active layer 22 (in particular, the well layer 22a) is a mixed crystal of AlN and GaN and the emission wavelength of GaN is longer than that of AlN, it is presumed that Ga contained in AlGaN composing the active layer 22 (in particular, the well layer 22a) segregates and current also flows in a segregated region, and thus light emits. That is, it is presumed that Ga segregates in the active layer 22 (in particular, the well layer 22a) by step flow growth in which the average roughness of the surface of the active layer 22 exceeds the thickness of the well layer 22a.

In addition, as described above, rounded terraces on the surfaces of the active layers 22 shown in FIGS. 7C and 8C also suggest the segregation of Ga. Specifically, it is presumed that when the active layer 22 (in particular, the well layer 22a having a large GaN molar fraction) is formed by step flow growth, Ga, which is easily migrated as compared to Al, is concentrated on the boundary between a side surface of a terrace and a surface of a terrace on the next step to smoothen steps, so that the terraces are rounded.

As shown in FIGS. 10A and 10B, comparing to sample 1 in which three-dimensional growth is dominant over step flow growth (the average roughness of the surface of the active layer 22 is larger than 10 nm), light outputs of samples 2 to 5 in which step flow growth is dominant are larger. It is thus found that the light output of the active layer 22 can be increased by segregating Ga in the active layer 22 (in particular, the well layer 22a).

As described above, it is possible to increase the light output of the active layer 22 by segregating Ga in the active layer 22 (in particular, the well layer 22a) with step flow grow in which the average roughness of the surface of the active layer 22 is the thickness of the well layer 22a or more and 10 nm or less. Consequently, it is possible to obtain the light-emitting element 1 that includes the active layer 22 having a high light output.

In addition, as shown in FIGS. 10A and 10B, Ga sufficiently segregates in the active layer 22 (in particular, the well layer 22a) in samples 2 to 5 in which the average roughness of the surface of the active layer 22 is larger than or equal to 3 nm. It is thus possible to sufficiently increase the light output of the active layer 22.

As shown in FIGS. 10A and 10B, comparing to sample 5 in which the average roughness of the surface of the active layer 22 is approximately 6 nm, the light outputs of samples 2 to 4 in which the average roughness of the surface of the active layer 22 is less than or equal to 6 nm are much larger (for example, 1.5 times or more). Consequently, if the average roughness of the surface of the active layer 22 is less than or equal to 6 nm (preferably, less than or equal to 5.5 nm), it is possible to significantly increase the light output of the active layer 22.

As shown in FIGS. 7A to 8C, in the light-emitting portion 20, the average roughness of the surface of the active layer 22 is substantially equal to the average roughness of the surface of the n-type cladding layer 21 formed immediately before the active layer 22. Not only the average roughness of the surface of the active layer 22 but also the average roughness of the surface of the n-type cladding layer 21 is the thickness of the well layer 22a or more (in particular, 3 nm or more) and 10 nm or less (in particular, 6 nm or less). In this case, the active layer 22 is formed by uniform growth in which the average roughness of a grown surface is kept, and thus Ga surely segregates in the active layer 22 (in particular, the well layer 22a). Consequently, it is possible to increase the light output of the active layer 22.

[AlN Layer of Underlying Portion]

Next, the state of a surface of the AlN layer 12 in the underlying portion 10 is described with reference to the drawings. FIGS. 11A to 16C are AFM images showing the state of surfaces of AlN layers in the underlying portions of samples 1 to 5 and sample A. Sample A is produced under intermediate conditions of conditions for sample 1 and conditions for sample 2.

FIGS. 11A, 12A, 13A, 14A, 15A, and 16A are AFM images showing the state of a 25 μm by 25 μm region on the surface of the AlN layer 12. FIGS. 11B, 12B, 13B, 14B, 15B, and 16B are AFM images showing regions narrower than the regions on the AlN layers 12 shown in FIGS. 11A, 12A, 13A, 14A, 15A, and 16A. FIGS. 11C, 12C, 13C, 14C, 15C, and 16C are AFM images showing the regions on the AlN layers 12 shown in FIGS. 11B, 12B, 13B, 14B, 15B, and 16B as three-dimensional bird's eye views. FIGS. 11A, 12A, 13A, 14A, 15A, and 16A also show an average width of a terrace (hereinafter, simply referred to as "terrace width") in an inclination direction of the substrate 11 as viewed from the top. FIGS. 11B, 12B, 13B, 14B, 15B, and 16B also show average height of a terrace (hereinafter, also referred to as "terrace height").

For example, the terrace width is calculated by randomly selecting a certain range with a predetermined distance (for example, 25 μm) in the inclination direction of the substrate 11 (left and right direction in the drawing) within the region shown in each of FIGS. 11A, 12A, 13A, 14A, 15A, and 16A, counting the number of terraces included in the range, and dividing the distance by the counted number of terraces. Alternatively, the terrace width may be calculated by repeating such a calculation for a plurality of times (for example, approximately 10 times) and averaging the resultant values.

In addition, the terrace height can be calculated by, for example, at the time of measuring the region shown in each of FIGS. 11B, 12B, 13B, 14B, 15B, and 16B with an AFM, calculating the difference between the height measured at the distal end of a terrace and the height of a terrace on the next step adjacent to the distal end and averaging the difference over a plurality of points (for example, approximately 50 points).

As shown in FIGS. 11A, 12A, 13A, 14A, 15A, and 16B, the terrace width tends to decrease in order of sample 1, sample A, sample 2, sample 3, sample 4, and sample 5. As shown in FIGS. 11B, 11C, 12B, 12C, 13B, 13C, 14B, 14C, 15B, 15C, 16B, and 16C, the terrace height tends to increase in order of sample 1, sample A, sample 2, sample 3, sample 4, and sample 5.

As described above, comparing to sample 1 and sample A, the terrace width is narrower and the terrace height is higher in samples 2 to 5 including the active layer 22 having a high light output (see FIGS. 10A and 10B). Specifically, the terrace width is 0.3 μm or more and 1 μm or less and the terrace height is 8 nm or more and 14 nm or less in samples 2 to 5.

As the light-emitting portion 20 is formed on the surface of the underlying portion 10 including such an AlN layer 12, it is possible to obtain the active layer 22 having a high light output, in which Ga segregates by step flow growth as described above.

[AlN Molar Fraction of Well Layer]

As can be seen from the fact that the peak emission wavelengths of samples 1 to 5 exemplified in the above description are within the range of 265 nm±3 nm as shown in FIGS. 9A and 9B, samples 1 to 5 have a substantially equal AlN fraction of the well layer 22a. However, even in the light-emitting element 1 having the well layer 22a whose AlN molar fraction is far different from those in samples 1 to 5, Ga may segregate similarly to samples 1 to 5.

Figure 17:
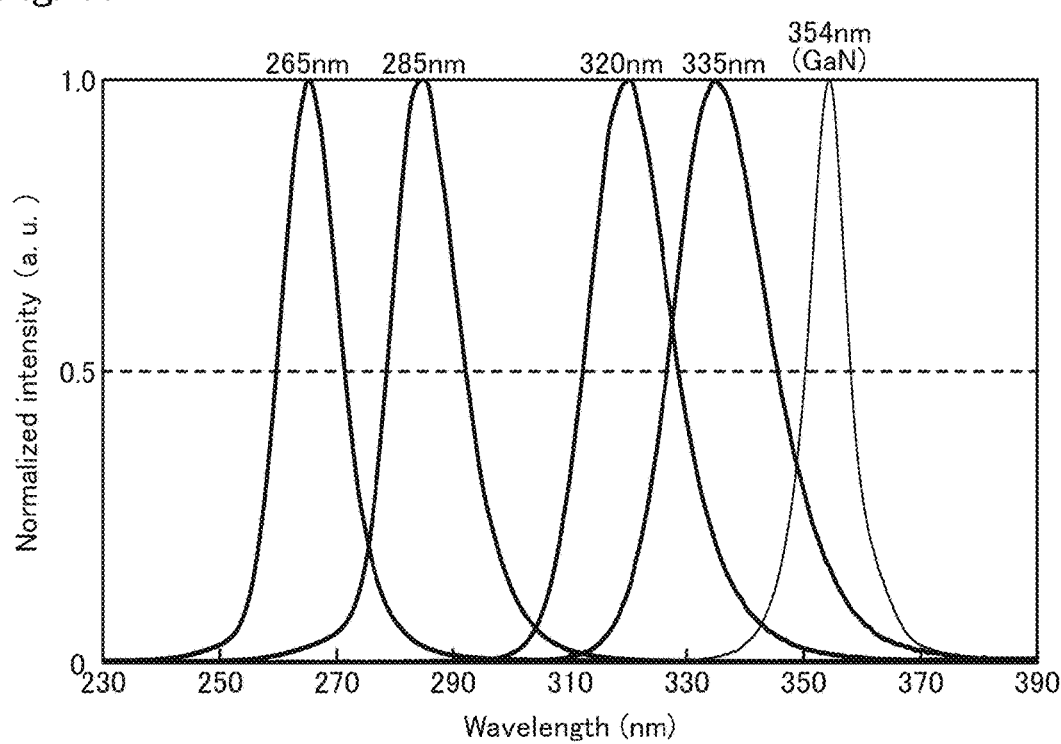
FIG. 17 is a spectrum diagram showing emission spectrums of a plurality of samples having different AlN molar fractions (peak emission wavelengths) of well layers.
Figure 18:
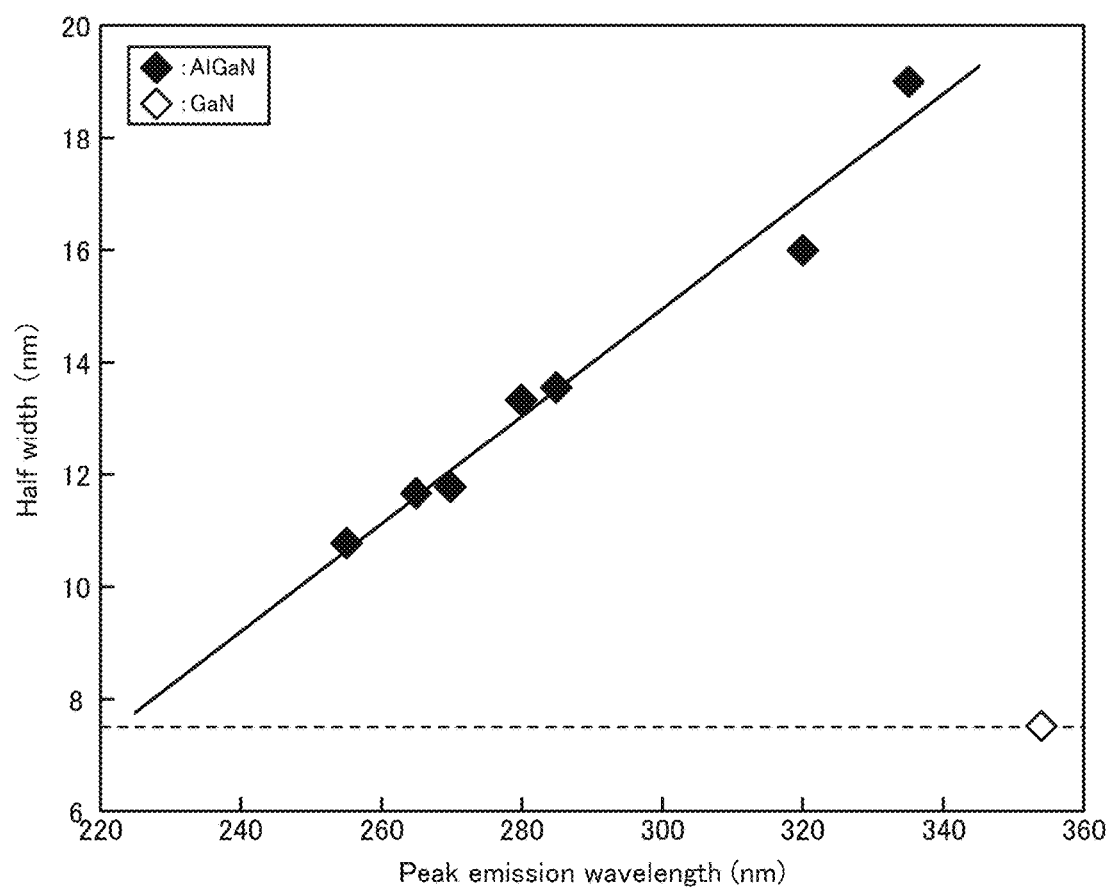
FIG. 18 is a graph showing a relationship between the peak emission wavelength and the half width of each sample.

The relationship between the segregation of Ga and the AlN molar fraction (the peak emission wavelength) of the well layer 22a is described below with reference to the drawings. FIG. 17 is a spectrum diagram showing emission spectrums of a plurality of samples having different AlN molar fractions (peak emission wavelengths) of well layers. FIG. 18 is a graph showing the relationship between the peak emission wavelength and the half width of each sample. FIGS. 17 and 18 also show a sample having the well layer 22a composed of GaN for comparison. In FIG. 17, for the purpose of easy understanding and comparison of outlines of emission spectrums, representative samples are selected from the samples shown in FIG. 18 and the intensity of the peak emission wavelength of each selected sample is normalized to 1. FIG. 18 also shows an approximate straight line of measurement results of the peak emission wavelength and the half width of each sample.

FIG. 17 shows the emission spectrums of the samples having a peak emission wavelength of 265 nm, a peak emission wavelength of 285 nm, a peak emission wavelength of 320 nm, a peak emission wavelength of 335 nm, and a peak emission wavelength of 354 nm. The sample having a peak emission wavelength of 265 nm is a sample having a peak emission wavelength substantially equal to those of the samples 1 to 5 described above. The sample having a peak emission wavelength of 354 nm (a thin curve in FIG. 17) is a sample having the well layer 22a composed of GaN.

In the sample having the well layer 22a composed of GaN (the sample having a peak emission wavelength of 354 nm), the well layer 22a is composed of a single crystal of GaN, and thus Ga does not segregate. In this case, there are small variations in the energy of electrons and holes confined in the well layer 22a, resulting in small variations in the energy difference between recombined electrons and holes (that is, small variations in the emission wavelength). Consequently, an emission spectrum having a narrow half width is obtained. This half width of the emission spectrum of the sample is a half width of an emission spectrum when Ga does not segregate and is used as a reference (hereinafter, referred to as "reference half width") for determining the existence or degree of segregation of Ga.

On the other hand, in the samples having the well layer 22a composed of $Al_xGa_{1-x}N$ (the samples having a peak emission wavelength of 265 nm, a peak emission wavelength of 285 nm, a peak emission wavelength of 335 nm, and a peak emission wavelength of 320 nm), the well layer 22a is composed of a mixed crystal of AlN and GaN, and thus Ga may segregate as described above. The half widths of the emission spectrums of these samples are wider than the reference half width. This is because the segregation of Ga results in large variations in the energy of electrons and holes confined in the well layer 22a and then large variations in the energy difference between recombined electrons and holes (that is, large variations in the emission wavelength).

However, the half widths of the emission spectrums of the samples differ (that is, the degree of segregation of Ga differs from sample to sample) as shown in FIGS. 17 and 18. Specifically, as the peak emission wavelength decreases, the half width also decreases. This is because as the AlN molar fraction X of $Al_xGa_{1-x}N$ composing the well layer 22a approximates 1 (that is, a single crystal of AlN), the amount of Ga decreases and thus Ga hardly segregates.

In this case, if the well layer 22a is composed of $Al_xGa_{1-x}N$ so that the peak emission wavelength is longer than or equal to 230 nm (preferably, longer than or equal to 240 nm and more preferably longer than or equal to 250 nm) as shown in FIG. 18, the half width of an emission spectrum can be sufficiently wider than the reference half width (a broken line in FIG. 18) (That is, it is possible to increase a light output by the segregation of Ga.).

On the other hand, as shown in FIGS. 17 and 18, as the peak emission wavelength increases, the half width also increases. However, as the AlN molar fraction X of $Al_xGa_{1-x}N$ composing the well layer 22a approximates 0 (that is, a single crystal of GaN), the amount of Ga increases and Ga segregates excessively. Consequently, there are problems that an emission spectrum is deformed (for example, a peak is divided into two or more peaks) and the intensity of emission decreases.

In this case, if the well layer 22a is composed of $Al_xGa_{1-x}N$ (0<X<1) so that the peak emission wavelength is shorter than or equal to 340 nm (preferably, shorter than or equal to 335 nm) as shown in FIGS. 17 and 18, these problems hardly occur.

In this way, as the peak emission wavelength is set to 230 nm or longer and 340 nm or shorter, Ga sufficiently segregates in the active layer 22 (in particular, the well layer 22a) thus increasing a light output. In addition, the problems that an emission spectrum deforms and the intensity of emission decreases hardly occur.

INDUSTRIAL APPLICABILITY

The present invention can be applied to a nitride semiconductor light-emitting element obtained by forming an AlGaN based active layer above a substrate composed of sapphire. In particular, it is preferable to apply the present invention to a nitride semiconductor ultraviolet light-emitting element having a peak emission wavelength in the ultraviolet region.

DESCRIPTION OF SYMBOLS 1 light-emitting element (nitride semiconductor ultraviolet light-emitting element)
10 underlying portion
11 substrate
12 AlN layer
20 light-emitting portion
21 n-type cladding layer
22 active layer
22a well layer
22b barrier layer
22c electron blocking layer
23 p-type cladding layer
24 p-type contact layer
30 p-electrode
40 n-electrode

The invention claimed is:

1. A nitride semiconductor ultraviolet light-emitting element comprising:
an underlying portion that includes a substrate that is composed of sapphire and has a surface inclined to a (0001) surface so as to form a multi-step terrace, and an AlN layer formed on a surface of the substrate; and
a light-emitting portion that is formed on a surface of the underlying portion and includes an active layer having an AlGaN based semiconductor layer, wherein
at least the AlN layer of the underlying portion, the active layer of the light-emitting portion, and each layer between the AlN layer and the active layer are epitaxial growth layers having a multi-step terrace on their respective surfaces,
the active layer has a quantum well structure including at least a well layer composed of $Al_xGa_{1-x}N$ (0<X<1), and wherein
average roughness of a 25 μm by 25 μm region on a surface of the active layer is a thickness of the well layer or more and 10 nm or less, the thickness of the well layer being between 2 nm and 10 nm.

2. The nitride semiconductor ultraviolet light-emitting element according to claim 1, wherein average roughness of a 25 μm by 25 μm region on a surface of the active layer included in the light-emitting portion is larger than or equal to 3 nm.

3. The nitride semiconductor ultraviolet light-emitting element according to claim 1, wherein average roughness of a 25 μm by 25 μm region on a surface of the active layer included in the light-emitting portion is less than or equal to 6 nm.

4. The nitride semiconductor ultraviolet light-emitting element according to claim 1, wherein average roughness of a 25 μm by 25 μm region on a surface of an layer that is included in the light-emitting portion and is formed immediately before the active layer is a thickness of the well layer or more and 10 nm or less.

5. The nitride semiconductor ultraviolet light-emitting element according to claim 1, wherein a rate obtained by dividing an absolute value of a difference between average roughness of a 25 μm by 25 μm region on a surface of the active layer and average roughness of a 25 μm by 25 μm region on a surface of a layer right below the active layer that is included in the light-emitting portion by average roughness of a 25 μm by 25 μm region on the surface of the active layer is less than or equal to 10%.

6. The nitride semiconductor ultraviolet light-emitting element according to claim 1, wherein on a surface of the AlN layer included in the underlying portion, an average width of a terrace in an inclination direction of the substrate as viewed from a top is 0.3 μm or more and 1 μm or less.

7. The nitride semiconductor ultraviolet light-emitting element according to claim 1, wherein on a surface of the AlN layer included in the underlying portion, an average step height of the multi-step terrace is 8 nm or more and 14 nm or less.

8. The nitride semiconductor ultraviolet light-emitting element according to claim 1, wherein on a surface of the active layer included in the light-emitting portion, a frequency distribution of a height of a 25 μm by 25 μm region has a curved shape in which as the height increases from 0, the height simply increases while changing from its downward convex curve to its upward convex curve to reach a maximum value, and the height then simply decreases while changing from its upward convex curve to its downward convex curve.

9. The nitride semiconductor ultraviolet light-emitting element according to claim 1, wherein a peak emission wavelength is 230 nm or more and 340 nm or less.

* * * * *